(12) United States Patent
Hudyma et al.

(10) Patent No.: US 6,985,210 B2
(45) Date of Patent: Jan. 10, 2006

(54) PROJECTION SYSTEM FOR EUV LITHOGRAPHY

(75) Inventors: Russell Hudyma, San Ramon, CA (US); Hans-Jürgen Mann, Oberkochen (DE); Udo Dinger, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/454,831

(22) Filed: Jun. 4, 2003

(65) Prior Publication Data

US 2004/0051857 A1 Mar. 18, 2004

Related U.S. Application Data

(63) Continuation of application No. PCT/EP01/14301, filed on Dec. 6, 2001, and a continuation-in-part of application No. 10/004,674, filed on Dec. 3, 2001, now Pat. No. 6,600,552, said application No. PCT/EP01/14301 and a continuation-in-part of application No. 09/503,640, filed on Feb. 14, 2000, now Pat. No. 6,353,470.

(60) Provisional application No. 60/255,161, filed on Dec. 12, 2000.

(30) Foreign Application Priority Data

Feb. 15, 1999 (DE) ............................... 199 06 001
Oct. 7, 1999 (DE) ............................... 199 48 240

(51) Int. Cl.
*G03B 27/54* (2006.01)
*G03B 27/42* (2006.01)

(52) U.S. Cl. .......................................... 355/67; 355/53
(58) Field of Classification Search ............... 355/53, 355/55, 67–71; 359/366, 731, 858, 859
See application file for complete search history.

(56) References Cited

U.S. PATENT DOCUMENTS 5,063,586 A 11/1991 Jewell et al. ................. 378/34

(Continued)

FOREIGN PATENT DOCUMENTS

DE 199 48 240 A1 8/2000

(Continued)

OTHER PUBLICATIONS

European Search Report for Application No. 99125783.3-2208.

(Continued)

*Primary Examiner*—Henry Hung Nguyen
(74) *Attorney, Agent, or Firm*—Ohlandt, Greeley, Ruggiero & Perle LLP.

(57) ABSTRACT

An EUV optical projection system includes at least six reflecting surfaces for imaging an object (OB) on an image (IM). The system is preferably configured to form an intermediate image (IMI) along an optical path from the object (OB) to the image (IM) between a secondary mirror (M2) and a tertiary mirror (M3), such that a primary mirror (M1) and the secondary mirror (M2) form a first optical group (G1) and the tertiary mirror (M3), a fourth mirror (M4), a fifth mirror (M5) and a sixth mirror (M6) form a second optical group (G2). The system also preferably includes an aperture stop (APE) located along the optical path from the object (OB) to the image (IM) between the primary mirror (M1) and the secondary mirror (M2). The secondary mirror (M2) is preferably concave, and the tertiary mirror (M3) is preferably convex. Each of the six reflecting surfaces preferably receives a chief ray (CR) from a central field point at an incidence angle of less than substantially 15°. The system preferably has a numerical aperture greater than 0.18 at the image (IM). The system is preferably configured such that a chief ray (CR) converges toward the optical axis (OA) while propagating between the secondary mirror (M2) and the tertiary mirror (M3).

35 Claims, 10 Drawing Sheets

U.S. PATENT DOCUMENTS

| | | | |
|---|---|---|---|
| 5,071,240 A | 12/1991 | Ichihara | 359/366 |
| 5,078,502 A | 1/1992 | Cook | 359/366 |
| 5,153,898 A | 10/1992 | Suzuki et al. | 378/34 |
| 5,212,588 A | 5/1993 | Viswanthan et al. | 359/355 |
| 5,220,590 A | 6/1993 | Bruning et al. | 378/34 |
| 5,272,568 A | 12/1993 | DeJager | 250/492.2 |
| 5,315,629 A | 5/1994 | Jewell et al. | 378/34 |
| 5,353,322 A | 10/1994 | Bruning et al. | 378/34 |
| 5,410,434 A | 4/1995 | Shafer | 359/858 |
| 5,686,728 A | 11/1997 | Shafer | 359/365 |
| 5,805,365 A | 9/1998 | Sweatt | 359/858 |
| 5,815,310 A | 9/1998 | Williamson | 359/857 |
| 5,956,192 A | 9/1999 | Williamson | 359/859 |
| 5,973,826 A | 10/1999 | Chapman et al. | 359/355 |
| 6,014,252 A | 1/2000 | Shafer | 359/355 |
| 6,033,079 A * | 3/2000 | Hudyma | 359/857 |
| 6,072,852 A | 6/2000 | Hudyma | 378/34 |
| 6,109,756 A * | 8/2000 | Takahashi | 359/857 |
| 6,142,641 A | 11/2000 | Cohen et al. | 359/859 |
| 6,172,825 B1 * | 1/2001 | Takahashi | 359/859 |
| 6,183,095 B1 | 2/2001 | Hudyma | 359/857 |
| 6,188,513 B1 * | 2/2001 | Hudyma et al. | 359/366 |
| 6,199,991 B1 * | 3/2001 | Braat | 359/856 |
| 6,226,346 B1 | 5/2001 | Hudyma | 378/34 |
| 6,255,661 B1 | 7/2001 | Braat | 250/492.2 |
| 6,262,836 B1 | 7/2001 | Hudyma et al. | 359/366 |

FOREIGN PATENT DOCUMENTS

| | | |
|---|---|---|
| EP | 0 779 528 | 6/1997 |
| EP | 0 779 528 A2 | 6/1997 |
| EP | 0 816 892 A2 | 7/1998 |
| EP | 1 178 356 A2 | 2/2002 |
| JP | 07283116 | 10/1995 |
| WO | WO99/57606 | 11/1999 |

OTHER PUBLICATIONS

Jewell, "Optical system design issues in development of projection camera for EUV lithography," Proceedings of the SPIE 2437:340-346 (1995).

"Design of Reflective Relay for Soft x-ray Lithography", Rodgers, et al., SPIE vol. 1364 International Lens Design Conference, 1990, pp. 330-336.

"Ring—Field EUVL Camera with Large Etendu", vol. 4 W.C. Sweatt, OSA TOPS on Extreme Ultraviolent Lithography, pp. 1996, 178-180.

"Reflective Systems Design Study for Soft X-Ray Projection Lithography", Jewell, et al., J. Vac Sci. Technol., B8 (6), Nov./Dec. 1990, pp., 1519-1523.

"Phase Shifting Diffraction Interferometry for Measuring Extreme Ultraviolet Optics," Gary E. Sommargren, OSA TOPS on Extreme Ultraviolet Lithography, 1996, pp. 108-112.

"EUV Optical Design for a 100 nm CD Imaging System", Sweeney, et al., SPIE vol. 3331, pp. 2-10. (undated).

* cited by examiner

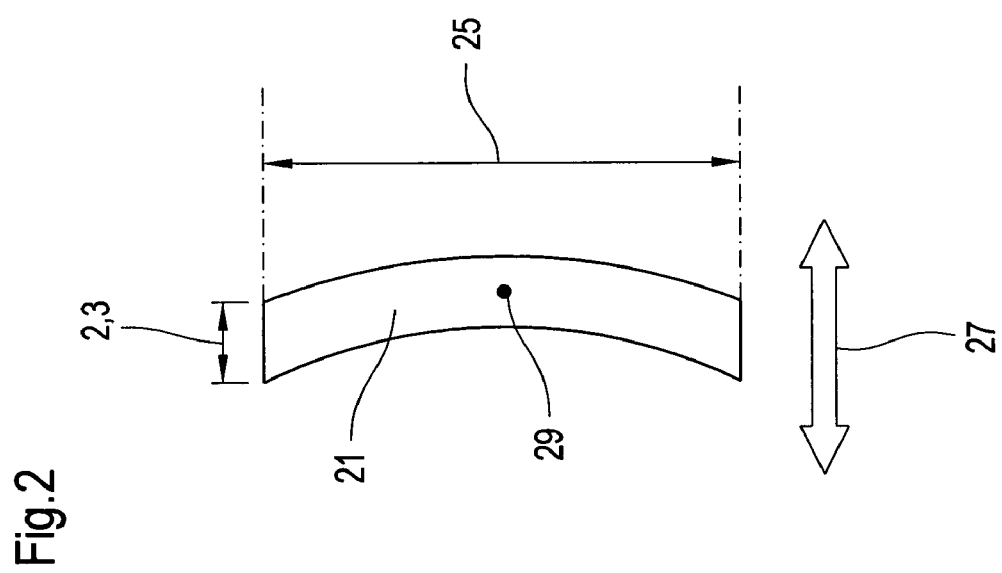

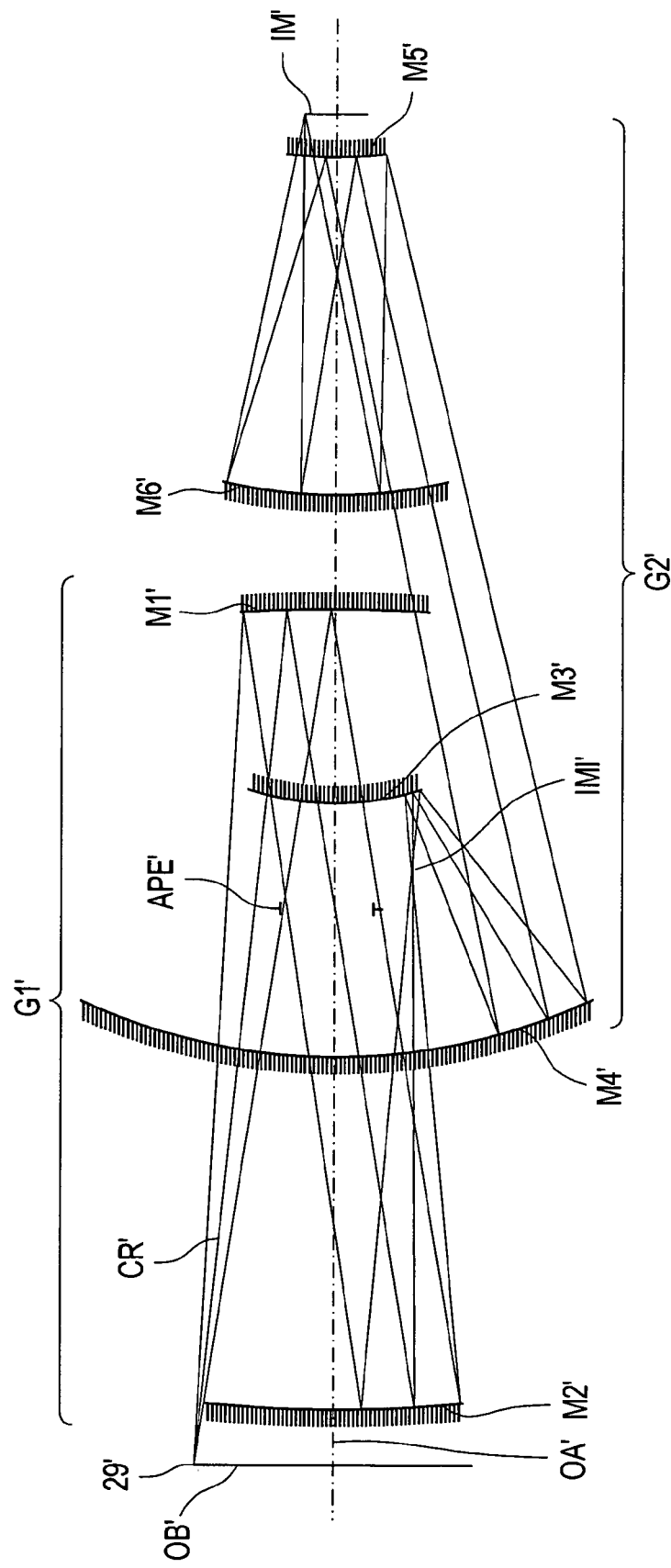

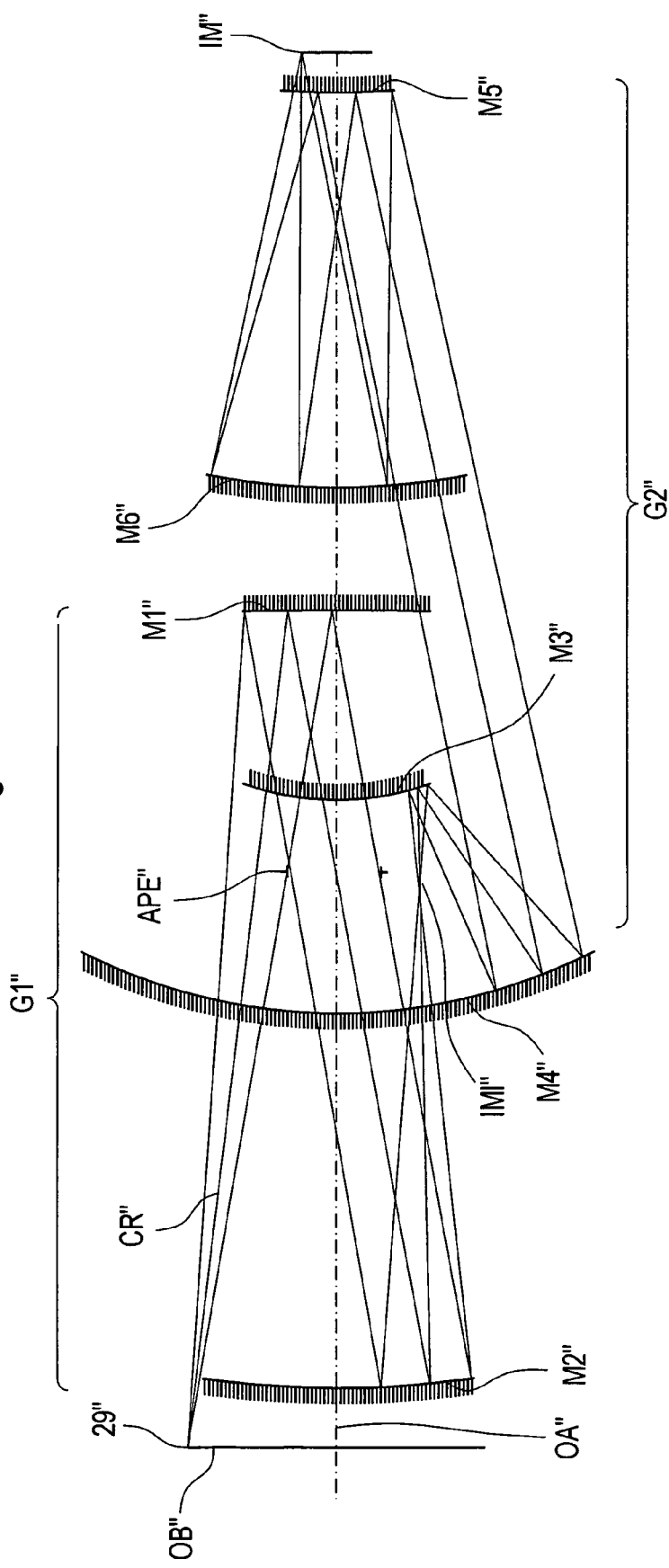

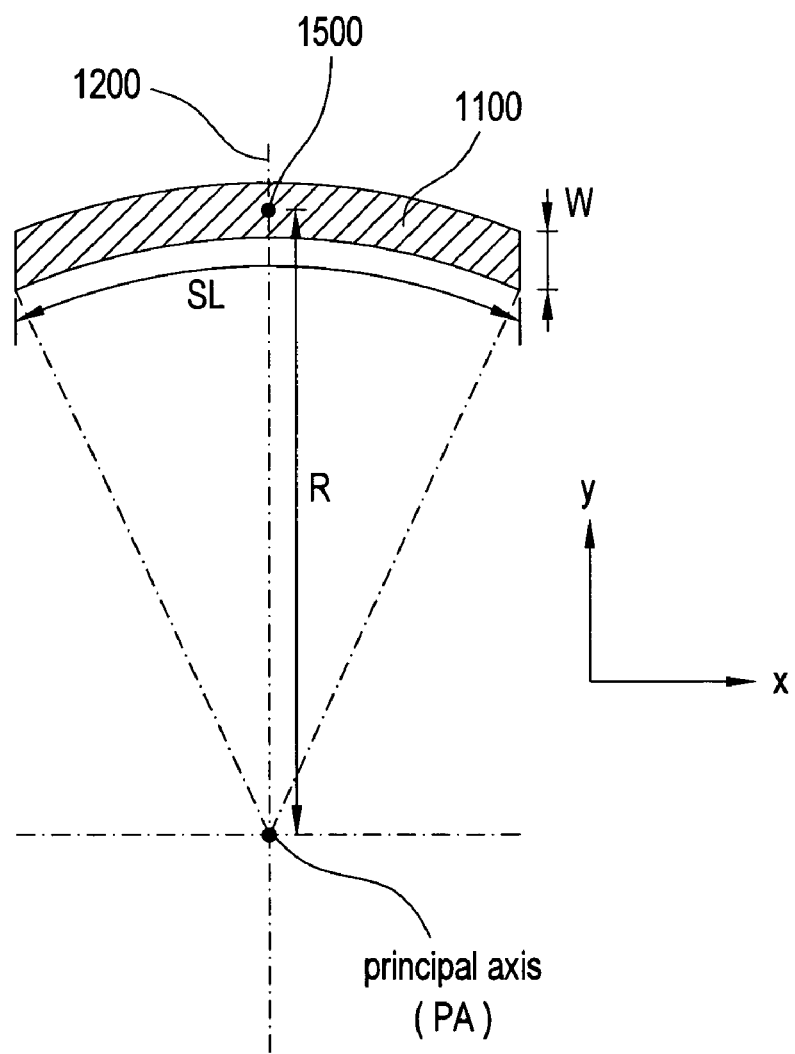

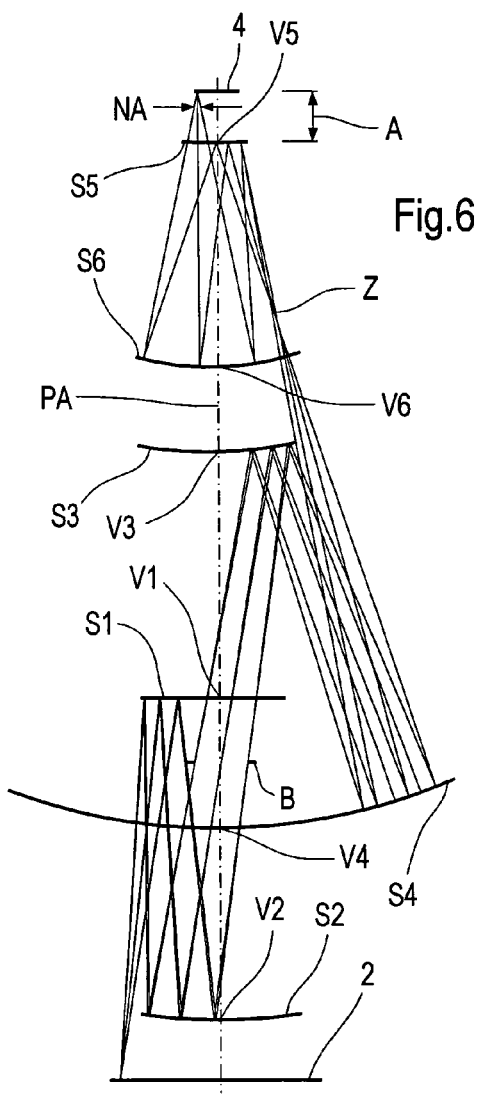
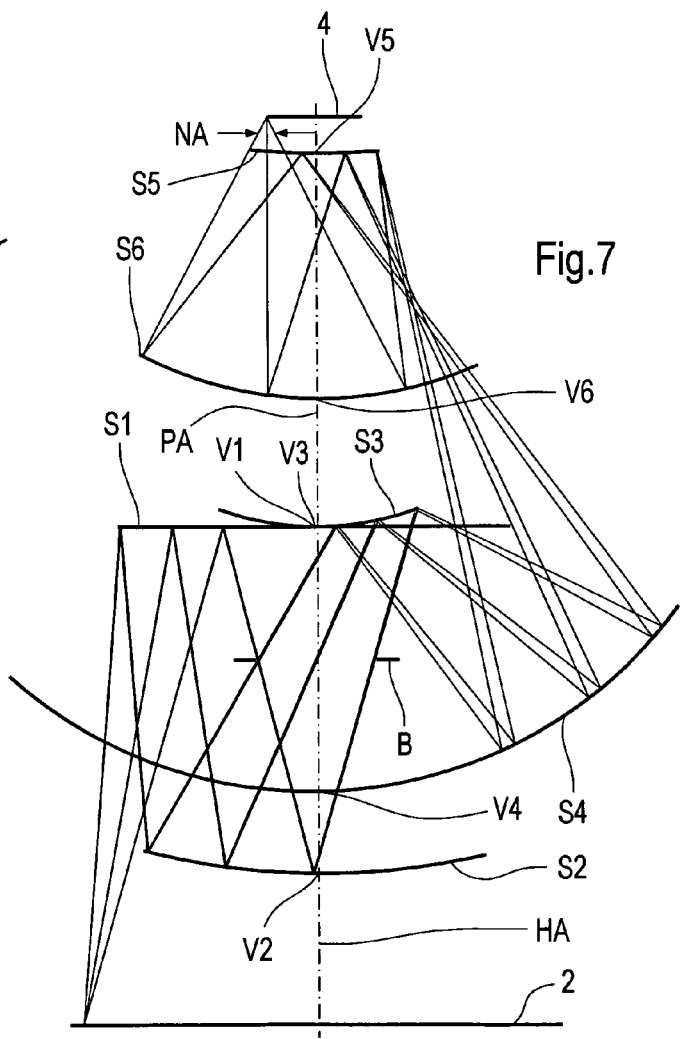
PRIOR ART

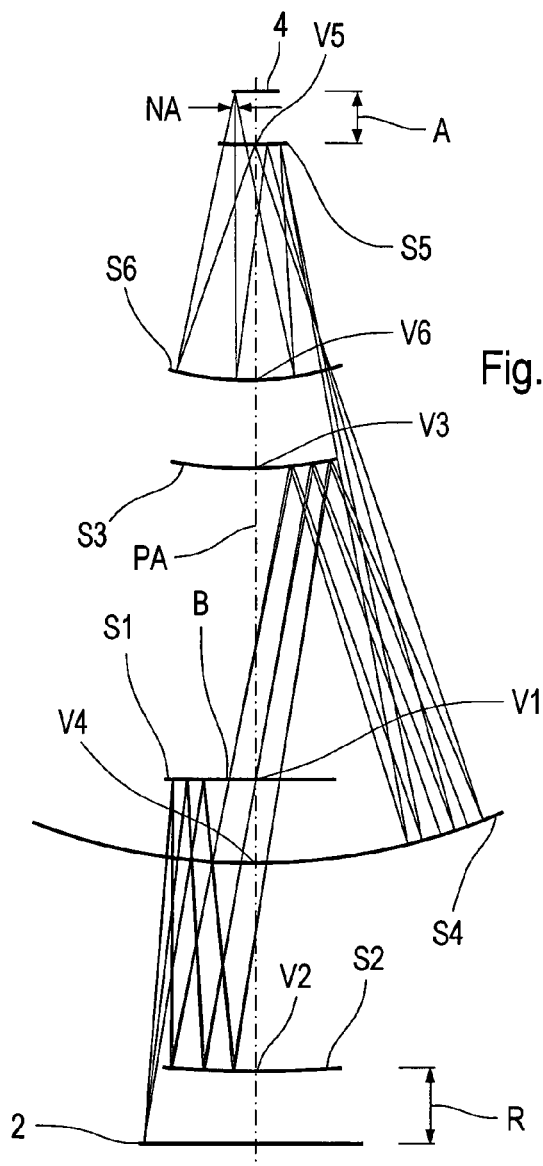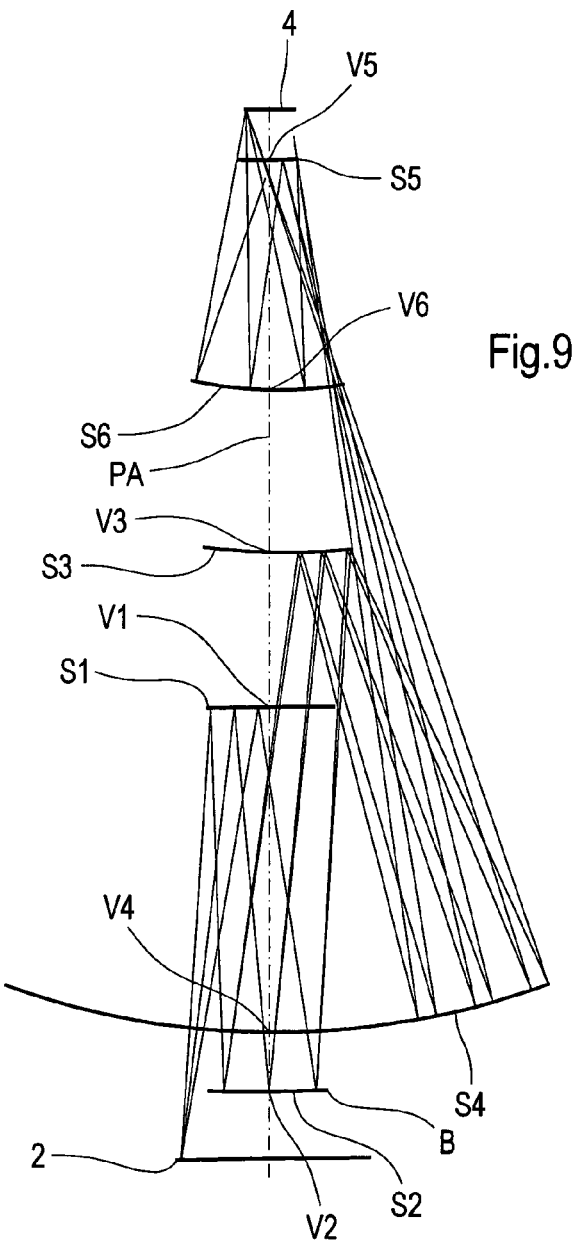

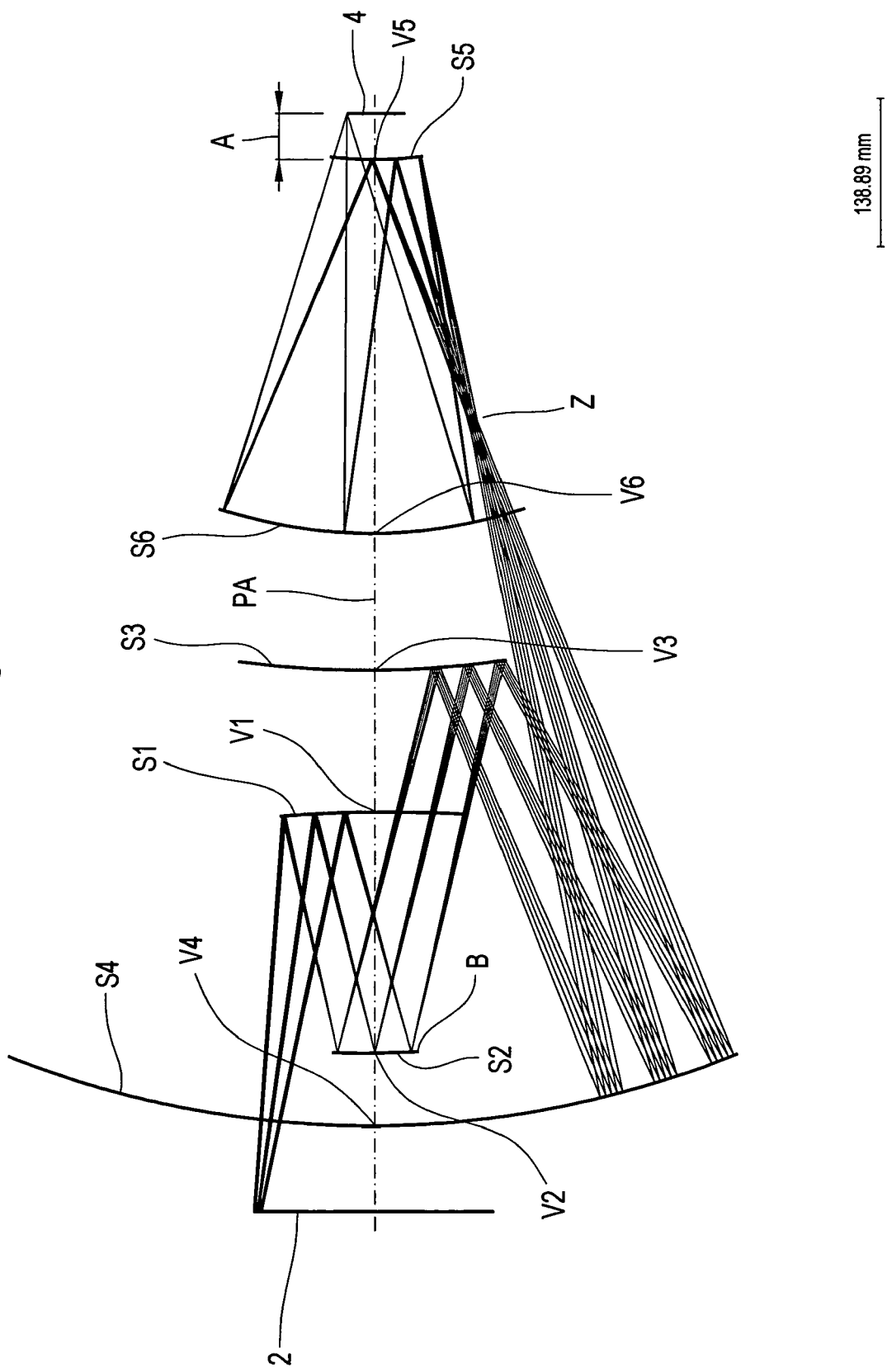

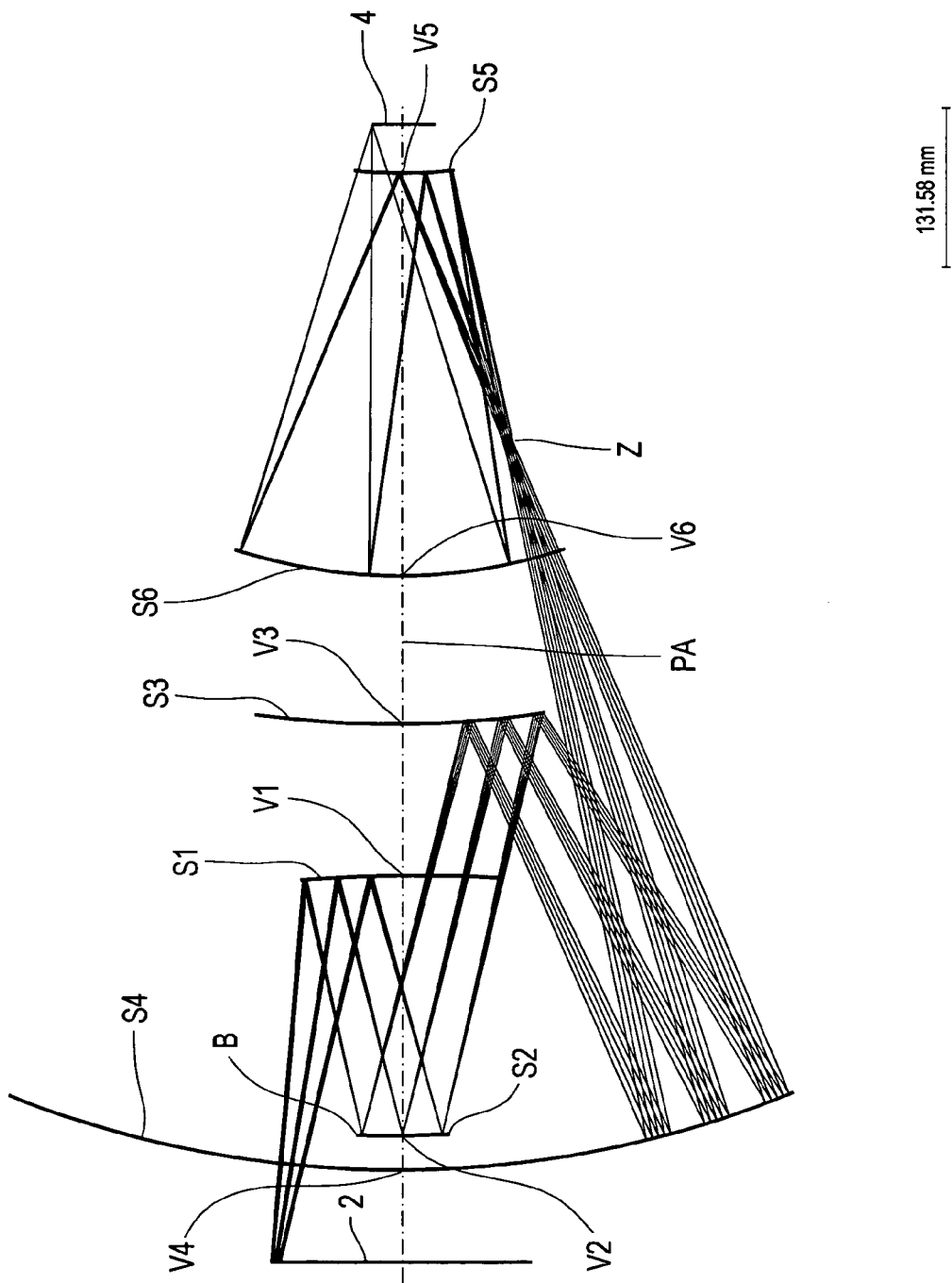

PROJECTION SYSTEM FOR EUV LITHOGRAPHY

CROSS-REFERENCE TO RELATED APPLICATIONS

The present application is a continuation of International Application No. PCT/EP01/14301 and a continuation-in-part of U.S. patent application Ser. No. 10/004,674. The PCT/EP01/14301 application was filed Dec. 6, 2001, and claims priority of U.S. Provisional Patent Application Ser. No. 60/255,161, which was filed Dec. 12, 2000. The Ser. No. 10/004,674 application was filed Dec. 3, 2001 now U.S. Pat. No. 6,600,552 and is a continuation-in-part of U.S. patent application Ser. No. 09/503,640. The Ser. No. 09/503,640 application was filed Feb. 14, 2000 and issued as U.S. Pat. No. 6,353,470. The present application is also claiming priority of (a) German Patent Application No. 199 06 001 filed Feb. 15, 1999, and (b) German Patent Application No. 199 48 240 filed Oct. 7, 1999.

BACKGROUND OF THE INVENTION

1. Field of the Invention

The present invention relates to a microlithography objective, a projection exposure apparatus containing the objective, and a method of manufacturing an integrated circuit using the same. More particularly, the present invention relates to an optical projection system for extreme ultraviolet (EUV) lithography, particularly including six mirrors arranged in two optical groups.

2. Description of the Related Art

It is widely accepted that current deep ultraviolet (DUV) projection printing systems used in a step and scan mode will be able to address the needs of the semiconductor industry for the next two or three device nodes. The next generation of photolithographic printing systems will use exposure radiation having soft x-ray or extreme ultraviolet wavelengths of approximately 11 nm to 15 nm, also in a step and scan printing architecture. To be economically viable, these next generation systems will require a sufficiently large numerical aperture to address sub 70 nm integrated circuit design rules. Further, these photolithography systems will require large fields of view in the scan direction to ensure that the throughput (defined in terms of wafers per hour) is sufficiently great so that the process is economically viable.

The theoretical resolution (R) of a lithographic printing system can be expressed by the well-known relationship $R=k_1\lambda/NA$, where $k_1$ is a process dependent constant, $\lambda$ is the wavelength of light, and NA is the numerical aperture of the projection system. Knowing that EUV resists support a $k_1$-factor of ~0.5 and assuming a numerical aperture of 0.20, an EUV projection system can achieve a theoretical resolution on the order of approximately 30 nm with $\lambda=13.4$ nm. It is recognized in the present invention that all reflective projection systems for EUV lithography for use in a step and scan architecture having both a large numerical aperture (0.20 to 0.30) and a large field (2 to 3 mm) are desired to address the sub-50 nm linewidth generations as defined by the International Sematech's International Technology Roadmap for Semiconductors (1999).

Four-mirror projection systems, such as those described in U.S. Pat. Nos. 5,315,629 and 6,226,346, issuing to Jewel and Hudyma, respectively, lack the degrees of freedom necessary to correct aberrations over a sufficiently large NA to achieve 30 nm design rules. The '346 patent teaches that a four-mirror projection system can be used to correct aberrations at a numerical aperture up to 0.14 (50 nm design rules). However, it is desired that the width of the ring field be reduced to enable wavefront correction to the desired level for lithography. The '346 patent demonstrates that the ring field is reduced from 1.5 mm to 1.0 mm as a numerical aperture is increased from 0.10 to 0.12. Further scaling of the second embodiment in the '346 patent reveals that the ring field must be reduced to 0.5 mm as a numerical aperture is increased further to 0.14. This reduction in ring field width results directly in reduced throughput of the entire projection apparatus. Clearly, further advances are needed.

Five-mirror systems, such as that set forth in U.S. Pat. No. 6,072,852, issuing to Hudyma, have sufficient degrees of freedom to correct both the pupil dependent and field dependent aberrations, thus enabling numerical apertures in excess of 0.20 over meaningful field widths (>1.5 mm). While minimizing the number of reflections has several advantages particular to EUV lithography, an odd number of reflections create a problem in that new stage technology would need to be developed to enable unlimited parallel scanning. To "unfold" the system to enable unlimited synchronous parallel scanning of the mask and image with existing scanning stage technologies, it is recognized herein that an additional mirror should be incorporated into the projection system.

Optical systems for short wavelength projection lithography utilizing six or more reflections have been disclosed in the patent literature.

One early six mirror system is disclosed in U.S. Pat. No. 5,071,240, issuing to Ichihara and Higuchi entitled, "Reflecting optical imaging apparatus using spherical reflectors and producing an intermediate image." The '240 patent discloses a 6-mirror catoptric or all-reflective reduction system utilizing spherical mirrors. This particular embodiment is constructed with three mirror pairs and uses positive/negative (P/N) and negative/positive (N/P) combinations to achieve the flat field condition. Ichihara and Higuchi also demonstrate that the flat field imaging condition (zero Petzval sum) can be achieved with a system that utilizes an intermediate image between the first mirror pair and last mirror pair. The patent teaches the use of a convex secondary mirror with an aperture stop that is co-located at this mirror. It is also clear from examination of the embodiments that the '240 patent teaches the use of low incidence angles at each of the mirror surfaces to ensure compatibility with reflective coatings that operate at wavelengths around 10 nm.

While the embodiments disclosed in the '240 patent appear to achieve their stated purpose, these examples are not well suited for contemporary lithography at extreme ultraviolet wavelengths. First, the systems are very long (~3000 mm) and would suffer mechanical stability problems. Second, the embodiments do not support telecentric imaging at the image which is desired for modern semiconductor lithography printing systems. Lastly, the numerical aperture is rather small (~0.05) leaving the systems unable to address 30 nm design rules.

Recently, optical projection production systems have been disclosed that offer high numerical apertures with at least six reflections designed specifically for EUV lithography. One such system is disclosed in U.S. Pat. No. 5,815,310, entitled, "High numerical aperture ring field optical projection system," issuing to Williamson. In the '310 patent, Williamson describes a six-mirror ring field projection system intended for use with EUV radiation. Each of the mirrors is aspheric and share a common optical axis. This particular embodiment has a numerical aperture of 0.25 and is capable of 30 nm lithography using conservative (~0.6) values for $k_1$. The '310 patent suggests that both PNPPNP and PPPPNP reimaging configurations are possible with a physically accessible intermediate image located between the third and fourth mirrors. This particular embodiment consists, from long conjugate to short conjugate, of a concave, convex, concave, concave, convex and concave mirror, or PNPPNP for short. The '310 patent suggests that both PNPPNP and the PPPPNP power distributions can achieve 30 nm design rules.

The preferred EUV embodiment disclosed in the '310 patent suffers from several drawbacks, one of which is the high incidence angles at each of the mirrored surfaces, particularly on mirrors M2 and M3. In some instances, the angle of incidence exceeds 24° at a given location on the mirror. Both the mean angle and deviation or spread of angles at a given point on a mirror surface is sufficient to cause noticeable amplitude and phase effects due to the EUV multilayer coatings that might adversely impact critical dimension (CD control).

Two other catoptric or all-reflective projection systems for lithography are disclosed in U.S. Pat. No. 5,686,728 entitled, "Projection lithography system and method using all-reflective optical elements," issuing to Shafer. The '728 patent describes an eight mirror projection system with a numerical aperture of about 0.50 and a six-mirror projection system with a numerical aperture of about 0.45 intended for use at wavelengths greater than 100 nm. Both systems operate in reduction with a reduction ratio of 5×. Like the systems described in the '310 patent, these systems have an annular zone of good optical correction yielding lithography performance within an arcuate shaped field. While these systems were designed for DUV lithography and are fine for that purpose, these embodiments make very poor EUV projection systems. Even after the numerical aperture is reduced from 0.50 to 0.25, the incidence angles of the ray bundles are very large at every mirror including the mask, making the system incompatible with either Mo/Si or Mo/Be multilayers. In addition, both the aspheric departure and aspheric gradients across the mirrors are rather large compared to the EUV wavelength, calling into question whether or not such aspheric mirrors can be measured to a desired accuracy for EUV lithography. Recognizing these issues, the '728 patent explicitly teaches away from using catoptric or all-reflective projection systems at EUV wavelengths and instead restricts their use to longer DUV wavelengths.

Another projection system intended for use with EUV lithography is disclosed in U.S. Pat. No. 6,033,079, issuing to Hudyma. The '079 patent entitled, "High numerical aperture ring field projection system for extreme ultraviolet lithography," describes two preferred embodiments. The first embodiment that the '079 patent describes is arranged with, from long to short conjugate, a concave, concave, convex, concave, convex, and concave mirror surfaces (PPNPNP). The second preferred embodiment from the '079 patent has, from long to short conjugate, a concave, convex, convex, concave, convex, and concave mirror surfaces (PNNPNP). The '079 patent teaches that both PPNPNP and PNNPNP reimaging configurations are advantageous with a physically accessible intermediate image located between the fourth and fifth mirror. In a manner similar to the '240 and '310 patents, the '079 patent teaches the use of an aperture stop at the secondary mirror and a chief ray that diverges from the optical axis after the secondary mirror.

The '079 patent teaches that the use of a convex tertiary mirror enables a large reduction in low-order astigmatism. This particular arrangement of optical power is advantageous for achieving a high level of aberration correction without using high incidence angles or extremely large aspheric departures. For both embodiments, all aspheric departures are below 15 μm and most are below 10 μm. Like the '240 patent, the '079 patent makes a significant teaching related to EUV via the use of low incidence angles on each of the reflective surfaces. The PPNPNP and PNNPNP power arrangements promote low incidence angles thus enabling simple and efficient EUV mirror coatings. The low incidence angles work to minimize coating-induced amplitude variations in the exit pupil, minimize coating-induced phase or optical path difference (OPD) variations in the exit pupil, and generally lower the tolerance sensitivity of the optical system. These factors combine to promote improved transmittance and enhanced CD uniformity in the presence of variations in focus and exposure.

While the prior art projection optical systems have proven adequate for many applications, they're not without design compromises that may not provide an optimum solution in all applications. Therefore, there is a need for a projection optical system that can be used in the extreme ultraviolet (EUV) or soft X-ray wavelength region that has a relatively large image field with capable of sub 50 nm resolution.

SUMMARY OF THE INVENTION

In view of the above, an EUV optical projection system is provided including at least six reflecting surfaces for imaging an object on an image. The system is configured to form an intermediate image along an optical path from the object to the image between a secondary mirror and a tertiary mirror, such that a primary mirror and the secondary mirror form a first optical group and the tertiary mirror and a fourth mirror, a fifth mirror and a sixth mirror form a second optical group. The secondary mirror is concave, and the tertiary mirror is convex.

The system may further include an aperture stop located along the optical path from the object to the image between the primary mirror and the secondary mirror. This aperture stop may be disposed off each of the first mirror and the second mirror.

The system may be further configured such that a chief ray from a central field point converges toward or propagates approximately parallel to the optical axis while propagating between the secondary mirror and the tertiary mirror. The primary mirror may be physically located closer to the object than the tertiary mirror.

The system may be further configured such that a chief ray from a central field point diverges away from the optical axis while propagating between the secondary mirror and the tertiary mirror. The tertiary mirror may be physically located closer to the object than the primary mirror.

The primary mirror is preferably concave, the fourth mirror is preferably concave, the fifth mirror is preferably convex and the sixth mirror is preferably concave.

The physical distance between the object and the image may be substantially 1500 mm or less, and may further be substantially 1200 mm or less.

The system preferably has a numerical aperture at the image greater than 0.18.

Each of the six reflecting surfaces preferably receives a chief ray from a central field point at an incidence angle of less than substantially 15°, preferably less than substantially 15°, and five of the six reflecting surfaces preferably receives a chief ray from a central field point at an incidence angle of less than substantially 11°, preferably less than substantially 9°.

The system is preferably configured to have a RMS wavefront error of 0.017λ or less, and may be between 0.017λ and 0.011λ.

In another embodiment, the shortcomings of the prior art are overcome by a projection objective having an object plane and an image plane and a light path for a bundle of light rays from the object plane to the image plane. The six mirrors of the objective are arranged in the light path from the object plane to the image plane. In such an embodiment the mirror closest to the image plane where e.g. an object to be illuminated such as a wafer is situated is arranged in such a way that an image-side numerical aperture is NA≧0.15. In this application the image-side numerical aperture is understood to be the numerical aperture of the bundle of light rays impinging onto the image plane. Furthermore, the mirror arranged closest to the image plane of the objective is arranged in such a way that the image-side free working distance corresponds at least to the used diameter of the mirror next to the wafer. In a preferred embodiment the image-side free working distance is at least the sum of one-third of the used diameter of the mirror next to the image plane and a length between 20 and 30 mm. In an alternative embodiment the image-side free working distance is at least 50 mm. In a particularly preferred embodiment, the image-side free working distance is 60 mm. In this application the free working distance is defined as the distance of the vertex of the surface of the mirror next to the image plane and the image plane. All surfaces of the six mirrors in this application are rotational-symmetric about a principal axis (PA). The vertex of a surface of a mirror is the intersection point of the surface of a mirror with the principal axis (PA). Each mirror has a mirror surface. The mirror surface is the physical mirror surface upon which the bundle of light rays traveling through the objective from the object plane to the image plane impinge. The physical mirror surface or the used area of a mirror can be an off-axis or an on-axis mirror segment relative to the principal axis (PA).

In another embodiment, a projection objective that comprises six mirrors is characterized by an image-side numerical aperture, NA, greater than 0.15 and an arc-shaped field width, W, at the wafer in the range 1.0 mm≦W. The peak-to-valley deviation, A, of the aspheres are limited with respect to the best fitting sphere of the physical mirror surface of all mirrors by:

$A \leq 19 \mu m - 102 \mu m (0.25 - NA) - 0.7 \mu m/mm (2 mm - W)$.

In a preferred embodiment, the peak-to-valley distance A of the aspheres is limited with respect to the best fitting sphere of the off-axis segments of all mirrors by:

$A \leq 12 \mu m - 64 \mu m (0.25 - NA) - 0.3 \mu m/mm (2 mm - W)$.

According to yet another embodiment, a projection objective that includes six mirrors is characterized by an image-side numerical aperture NA≧0.15 and an image-side width of the arc-shaped field W≧1 mm, and the angles of incidence AOI are limited for all rays of the light bundle impinging a physical mirror surface on all six mirrors S1, S2, S3, S4, S5, S6 by:

$AOI \leq 23° - 35° (0.25 - NA) - 0.2°/mm (2 mm - W)$.

wherein the angles of incidence AOI refer to the angle between the incident ray and the normal to the physical mirror surface at the point of incidence. The largest angle of any incident bundle of light rays occurring on any of the mirrors is always given by the angle of a bundle-limiting ray.

Preferably, an embodiment of the invention would encompass all three of the above aspects, e.g., an embodiment in which the free optical working distance would be more than 50 mm at NA=0.20 and the peak-to-valley deviation of the aspheres, as well as the angles of incidence, would lie in the regions defined above.

The asphericities herein refer to the peak-to-valley (PV) deviation, A, of the aspherical surfaces with respect to the best fitting sphere of the physical mirror surface of an specific mirror. The physical mirror surface of a specific mirror is also denoted as the used area of this specific mirror. The aspherical surfaces are approximated in the examples by using a sphere. The sphere has a center on the figure axis vertex of the mirror. The sphere intersects the asphere in the upper and lower endpoint of the used area in the meridian section. The data regarding the angles of incidence always refer to the angle between the incident ray and the normal to the physical mirror surface at the point of incidence. The largest angle of any incident bundle of light rays occurring on any of the physical mirror surfaces is always given by the angle of a bundle-limiting ray. The used diameter or the diameter of the physical mirror surface will be defined here and below as the envelope circle diameter of the physical mirror surface or the used area of a mirror, which is generally not circular.

In a preferred embodiment the free working distance is 60 mm.

The objective can be used not only in the EUV, but also at other wavelengths, without deviating from the scope of the invention. In any respect, however, to avoid degradation of image quality, especially degradation due to central shading, the mirrors of the projection objectives should be arranged so that the light path of the bundle of light rays traveling from the object plane to the image plane is obscuration-free. Furthermore, to provide easy mounting and adjusting of the system, the physical mirror surfaces have a rotational symmetry to a principal axis (PA). Moreover, to have a compact design with an accessible aperture and to establish an obscuration-free light path of the bundle of light rays traveling from the object plane to the image plane, the projection objective device is designed in such a way that an intermediate image of the object situated in the object plane is formed after the fourth mirror. In such systems, it is possible that the aperture stop is situated in the front, low-aperture objective part, with a pupil plane conjugated to the aperture stop imaged in the focal plane of the last mirror. Such a system ensures telecentricity in the image plane.

In an preferred embodiment of the invention, the aperture stop is freely accessible and arranged in the light path from the object plane to the image plane between the second and third mirror. Good accessibility of the aperture stop is ensured when the ratio of the distance between the first and third mirror to the distance between the first and second mirror lies in the range of:

$0.5 < S1S3/S1S2 < 2$.

As defined for the free working distance in general a distance between two mirrors is the distance of the vertices of the surfaces of these mirrors.

Furthermore, in order to prevent vignetting of the light running from the third to the fourth mirror, by the aperture stop arranged between the second and third mirror, the ratio of the distance between the second mirror and aperture stop to the distance between the third mirror and the aperture stop lies in the range:

$0.5 < S2 \text{ aperture}/(S3 \text{ aperture}) < 2$.

In such a system, the angles of incidence on the physical mirror surfaces in the front part of the objective are reduced.

An aperture stop which physically lies between the second mirror, S2, and the first mirror, S1, must be formed at least partially as a narrow ring in order to avoid clipping of light moving from S1 to S2. In such a design, there is a danger that undesirable direct light or light reflected on S1 and S2, will pass outside the aperture ring and reach the image plane and thus the wafer. However, if the aperture stop is placed in the light path between the second and third mirror and physically close to the first mirror (which can be easily achieved mechanically), an efficient masking of this undesired light is possible. The aperture stop can be designed both as an opening in the first mirror or an opening which is arranged behind the first mirror.

In another embodiment of the invention, the aperture stop is arranged on or near the second mirror. Arrangement of the aperture on a mirror has the advantage that it is easier to manufacture.

In order to ensure an obscuration-free ray path with simultaneously low angles of incidence, the ratio of the distance between the first and third mirrors (S1S3) to the distance between the first and second mirrors (S1S2) lies in the range:

$$0.3 \leq S1S3/S1S2 \leq 2.0,$$

while the ratio of the distance between the second and third mirrors (S2S3) to the distance between the third and fourth mirrors (S3S4) lies in the range:

$$0.7 \leq S2S3/S3S4 \leq 1.4.$$

In order to be able to make the necessary corrections of imaging errors in the six-mirror systems, in a preferred embodiment, all six mirrors are designed to be aspherical. However, an alternative embodiment whereby at most five mirrors are aspherical can simplify the manufacturing, because it is then possible to design one mirror, preferably the largest mirror, i.e., the quaternary mirror, in the form of a spherical mirror. Moreover, it is preferred that the second to sixth mirror be in a concave-convex-concave-convex-concave sequence.

In order to achieve a resolution of at least 50 nm, the design part of the rms wavefront section of the system should be at most $0.07\lambda$ and preferably $0.03\lambda$.

Advantageously, in the embodiments of the invention, the objectives are always telecentric on the image-side.

In projection systems which are operated with a reflection mask, a telecentric light path on the object-side is not possible without illumination through a beam splitter which reduces the transmission strongly. One such device is known from JP 95 28 31 16.

In systems with transmission mask, the projection objective can be telecentric on the object side. In these embodiments, the first mirror is preferably concave.

The telecentericity error in the image plane, where the the wafer is situated should not exceed 10 mrad and is typically between 5 mrad and 2 mrad, with 2 mrad being preferred. This ensures that changes of the imaging ratio remain within tolerable limits over the depth of focus.

In an preferred embodiments of the invention, the six mirror objective could comprise a field mirror, a reducing three-mirror subsystem and a two-mirror subsystem.

In addition to the projection objective also a projection exposure apparatus is shown, that includes at least a projection objective device. In a first embodiment, the projection exposure apparatus has a reflection mask, while in an alternative embodiment, it has a transmission mask. Preferably, the projection exposure apparatus includes an illumination device for illuminating an off-axis arc-shaped field and the system is designed as an arc-shaped field scanner. Furthermore, the secant length of the scan slit is at least 26 mm and the ring width is greater than 0.5 mm.

The invention will be described below with the aid of the drawings as examples.

BRIEF DESCRIPTION OF THE DRAWINGS

FIG. 2 schematically illustrates the geometry of the arcuate ring field according to the preferred embodiments at the object.

FIG. 3 shows a plan view of an EUV optical projection system according to a second preferred embodiment.

FIG. 4 shows a plan view of an EUV optical projection system according to a third preferred embodiment.

FIG. 5 shows the ring field in the object plane of the objective.

FIG. 6 shows an embodiment with an intermediate image, a freely accessible aperture stop between a second and third mirror, and a image side numerical aperture of 0.2.

FIG. 7 shows a prior art six-mirror objective arrangement for wavelengths >100 nm as disclosed in U.S. Pat. No. 5,686,728.

FIG. 8 shows a second embodiment with an aperture stop between the second and third mirror at the first mirror.

FIG. 9 shows a third embodiment with an aperture stop on the second mirror and a working distance of 59 mm.

FIG. 10 shows a fourth embodiment with an intermediate image, a image side numerical aperture NA of 0.28 as well as a free working distance on the image-side which is at least the sum of one-third of the useful diameter of the mirror nearest to the wafer and a length which lies between 20 and 30 mm.

FIG. 11 shows a fifth embodiment of a system with an intermediate image and a image side numerical aperture NA of 0.30.

INCORPORATION BY REFERENCE

What follows is a cite list of references which, in addition to that which is described in the background and brief summary of the invention above, are hereby incorporated by reference into the detailed description of the preferred embodiments, as disclosing alternative embodiments of elements or features of the preferred embodiment not otherwise set forth in detail below. A single one or a combination of two or more of these references may be consulted to obtain a variation of the preferred embodiments described below. Further patent, patent application and non-patent references, and discussion thereof, cited in the background and/or elsewhere herein are also incorporated by reference into the detailed description of the preferred embodiments with the same effect as just described with respect to the following references:

U.S. Pat. Nos. 5,063,586, 5,071,240, 5,078,502, 5,153,898, 5,212,588, 5,220,590, 5,315,629, 5,353,322, 5,410,434, 5,686,728, 5,805,365, 5,815,310, 5,956,192, 5,973,826, 6,033,079, 6,014,252, 6,188,513, 6,183,095, 6,072,852, 6,142,641, 6,226,346, 6,255,661 and 6,262,836;

European patent applications no. 0 816 892 A1 and 0 779 528 A; and

"Design of Reflective Relay for Soft X-Ray Lithography", J. M. Rodgers, T. E. Jewell, International Lens Design Conference, 1990;

"Reflective Systems design Study for Soft X-ray Projection Lithography", T. E. Jewell, J. M. Rodgers, and K. P. Thompson, J. Vac. Sci. Technol., November/December 1990.

"Optical System Design Issues in Development of Projection Camera for EUV Lithography", T. E. Jewell, SPIE Volume 2437, pages 340–347;

"Ring-Field EUVL Camera with Large Etendu", W. C. Sweatt, OSA TOPS on Extreme Ultraviolet Lithography, 1996; and "Phase Shifting Diffraction Interferometry for Measuring Extreme Ultraviolet Optics", G. E. Sommargaren, OSA TOPS on Extreme Ultraviolet Lithography, 1996;

"EUV Optical Design for a 100 nm CD Imaging System", D. W. Sweeney, R. Hudyma, H. N. Chapman, and D. Shafer, SPIE Volume 3331, pages 2–10.

DETAILED DESCRIPTION OF THE PREFERRED EMBODIMENTS

Three specific preferred embodiments relating to this optical projection system are described.

Figure 1:
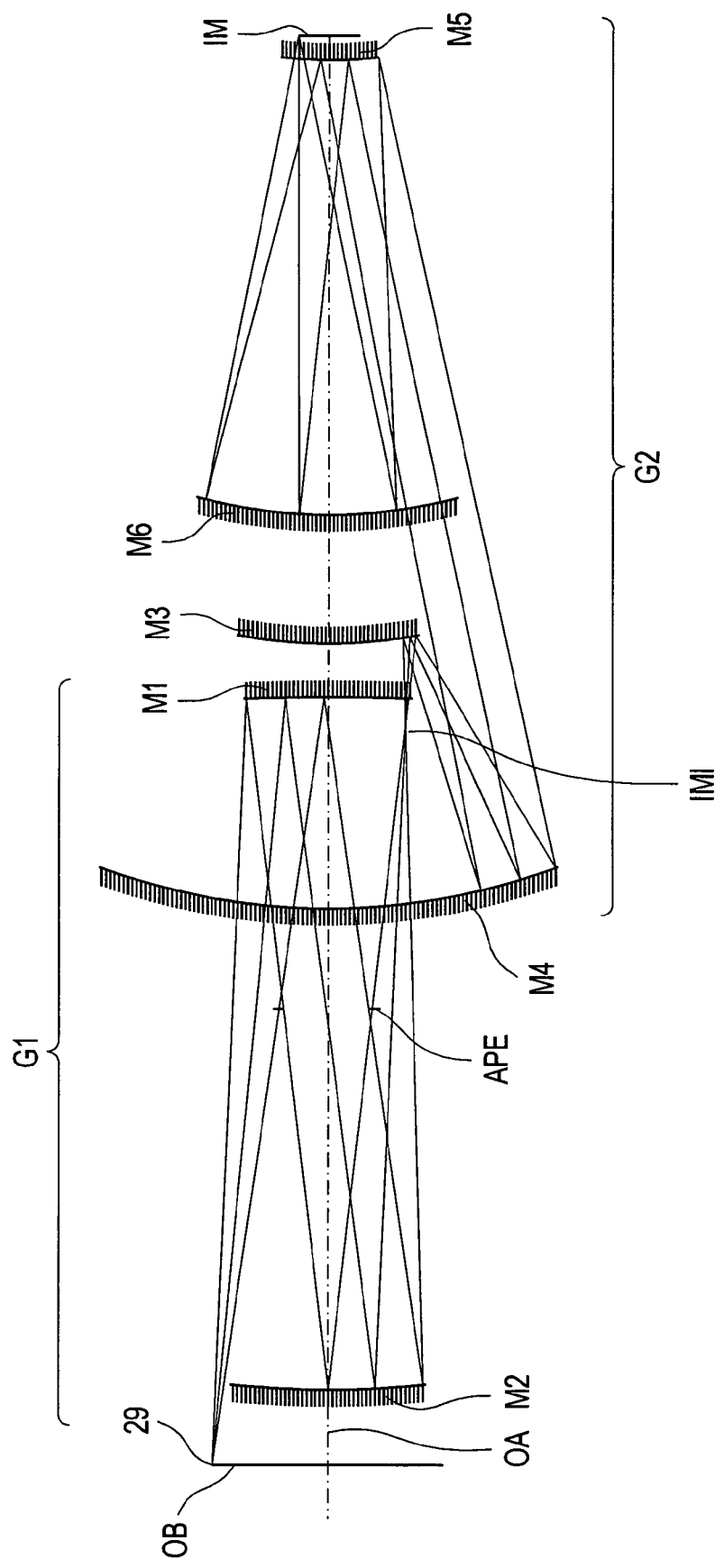
FIG. 1 shows a plan view of an EUV optical projection system according to a first preferred embodiment.

First Preferred Embodiment:

FIG. 1 shows a plan view of a first preferred embodiment, and, taking in conjunction with Table 1 and Table 2, provides an illustrative, exemplary description of this embodiment. Light impinges on an object, e.g. a reflective mask or reticle from an illumination system and is directed to concave mirror M1 after which it reflects from the mirror M1 and passes through a physically accessible aperture stop APE that is located between Mirror M1 and M2. This aperture stop APE is located a substantial distance from the first concave mirror M1 and, likewise, this aperture stop APE is located a substantial distance from concave mirror M2. After the illumination reflects off concave mirror M2, the light comes to a focus at an intermediate image IMI that is located in close proximity to convex mirror M3. From mirror M3 the illumination is directed toward concave mirror M4 where the light is nearly collimated and directed toward convex mirror M5. Upon reflection from mirror M5, the light impinges on concave mirror M6 where it is reflected in a telecentric manner (the chief rays are parallel to the optical axis OA) and focused on the image IM. A semiconductor wafer is typically arranged at the position of the image IM. Since a concave optical surface has positive optical power (P) and a convex optical surface has negative optical power (N), this present embodiment may be characterized as a PPNPNP configuration.

Although there are many ways to characterize this optical system, one convenient way is to break the system into two groups G1 and G2. Starting at the object OB, the first group G1 is comprised the concave mirror pair M1 and M2. This group forms an intermediate image IMI at a magnification of about −0.8× between mirror M2 and mirror M3. The remaining four mirrors (convex mirror M3, concave mirror M4, convex mirror M5 and concave mirror M6) comprise the second imaging or relay group G2. This second group G2 works at a magnification of approximately −0.3×, resulting in 4× reduction (the reduction ratio is the inverse of the absolute value of the optical magnification) of the object OB at the image IM.

The optical prescription of the first embodiment of FIG. 1 is listed in Table 1 and Table 2. The aspheric mirror surfaces are labeled A(1)–A(6) in the tables with A(1) corresponding to mirror M1, A(2) corresponding to mirror M2, and so on. Four additional surfaces complete the description of this illustrative and exemplary embodiment with object OB and image IM representing the planes, where in a lithographic apparatus the mask and the wafer are arranged. A surface designation is also made for the location of the aperture stop APE and intermediate image IMI. After each surface designation, there are two additional entries listing the vertex radius of curvature (R) and the vertex spacing between the optical surfaces. In this particular embodiment, each of the surfaces is rotationally symmetric conic surface with higher-order polynomial deformations. The aspheric profile is uniquely determined by its K, A, B, C, D, and E values. Each mirror uses 4th, 6th, 8th, 10th, and 12th order polynomial deformations. The sag of the aspheric surface (through 12th order) in the direction of the z-axis (z) is given by:

$$z = \frac{ch^2}{1+\sqrt{1-(1+k)c^2h^2}} + Ah^4 + Bh^6 + Ch^8 + Dh^{10} + Eh^{12}$$

where h is the radial coordinate; c is the vertex curvature of the surface (1/R); and A, B, C, D, and E are the 4th, 6th, 8th, 10th, and 12th order deformation coefficients, respectively. These coefficients are listed in Table 2.

The optical system of this first preferred embodiment is designed to project a ring field format that is illuminated with extremely ultraviolet (EUV) or soft X-ray radiation. The numerical aperture NAO at the object OB is 0.050 radians; at a 4× reduction this corresponds to a numerical aperture NA of 0.20 at the image IM. The ring field 21 at the object OB is shown with FIG. 2. It is centered at 118 mm from the optical axis, which contains the vertex of each of the aspheric mirrors. This annular field extends from 114 mm to 122 mm forming an arcuate slit with a width 23 of 8 mm. The extent 25 of the ring field 21 perpendicular to the scan direction 27 becomes 104 mm. The central field point is denoted with the reference sign 29. At 4× reduction, this ring field becomes 2.0 mm wide in the scan direction at the image.

As a result of the distribution of optical power and location of the aperture stop APE, the incidence angles are well controlled so that the design is compatible with EUV or soft X-ray multilayer coatings. As measured by the chief ray CR from the central field point 29, this system exhibits very low incidence angles ranging from 2.9° to 12.5°. The chief ray incidence angles for the chief ray CR from the central field point 29 are: Object: 5.2°; M1: 6.5°; M2: 5.0°; M3: 12.5°; M4: 5.6°, M5: 8.6°, and M6: 2.9°. These low incidence angles are a key enabling element for EUV lithography since (1) they minimize the multilayer induced amplitude and phase errors that have an adverse impact to lithographic performance and (2) enable simplified coating designs that do not rely heavily on the use of laterally graded coating profiles. With poor design (i.e., failure to minimize these incidence angles), these multilayer-induced amplitude and phase errors can lead to critical dimension (CD) errors that are easily greater than 20% of the nominal linewidth, making the system unusable for production applications.

Besides the low incidence angles, a preferred system further enables EUV lithography by utilizing mirrors with low peak aspheric departure. The maximum peak departure, contained on mirror M1, is 25.0 µm. The other mirrors have low-risk aspheres with departures that range from 0.5 µm to 14 µm. The low aspheric departures of the mirror surfaces facilitate visible light metrology testing without a null lens or Computer Generated Hologram CGH, resulting in surface figure testing to a high degree of accuracy. An aspheric mirror with a very large peak departure is unproducible because it cannot be measured to the required accuracy to realize lithographic performance.

Table 3 summarizes the performance of the PPNPNP configuration of FIG. 1. The table demonstrates that this first preferred embodiment is able to achieve lithographic performance with a resolution on the order of 30 nm (assuming a k1-factor of approximately 0.5). The location of the aperture stop APE is selected so that the third order astigmatism contribution from the strong concave secondary mirror M2 is made very small. The strongly undercorrected astigmatic contribution from the primary mirror M1 comes from the aspheric departure on M1 and is balanced by the M3/M4 combination. Considering the system without any aspheres, the location of the aperture stop APE also effectively balances the third-order coma and distortion contributions from the primary mirror M1 and secondary mirror M2. A hyperbolic profile is added to the primary mirror M1 in such a way as to create a large undercorrected spherical contribution, coma contribution, and astigmatism contribution, thus promoting good aberration correction allowing the residual wavefront error (departure from the ideal reference sphere) to remain exceedingly small. In fact, aberration correction and resulting aberration balance reduces the composite RMS wavefront error is only 0.0125λ (0.17 nm), with simultaneous correction of the static distortion to less than 2 nm across the field.

This optical projection system has further benefits in that the system of FIG. 1 may be scaled in either numerical aperture or field. For example, it is desirable to scale this concept to larger numerical aperture to improve the modulation in the aerial image thus allowing 30 nm resolution with a less aggressive k1-factor. The results of a simple scaling experiment demonstrate that this preferred embodiment easily supports such scaling to larger numerical apertures. Without making any modifications, an analysis of the composite root mean square (RMS) wavefront error was made at a numerical aperture of 0.24, which represents a 20% increase to the value shown in Table 2. The composite RMS wavefront error was found to be 0.0287λ (0.38 nm), a level that supports lithographic quality imaging.

Referring to FIG. 2, it is desirable to increase the field of view in the scan direction to increase the number of wafers per hour (WPH) that the lithographic apparatus can process. The idea is that more area can be printed per unit time with a wider arcuate slit. The results of another simple scaling experiment demonstrate that this preferred embodiment easily supports increases in field width. Without making any modifications, an analysis of the composite RMS wavefront error was made over a 3 mm wide arcuate slit, which represents a 50% increase to the value shown in Table 2. The composite RMS wavefront error was found to be 0.0285λ (0.38 nm), again a level that supports lithographic quality imaging.

Second Preferred Embodiment:

In a second of these general embodiments, an optical projection system for extreme ultraviolet (EUV) lithography including six mirrors arranged in a PPNPNP configuration is disclosed. The plan view of this second preferred embodiment is shown in FIG. 3, which demonstrates a PPNPNP configuration designed for EUV lithography at a wavelength of 13.4 nm. Like the first preferred embodiment, the system is reimaging, and unlike the '310 and '079 embodiments, locates the intermediate image IMI' before the second mirror pair. In this example, the intermediate image IMI' is located between mirror M2' and M3', helping to promote low incidence angle variation across mirror M5'. This construction also enables low mean incidence angles on mirror M1', M2', M4', and M6'. These low incidence angles are advantageous for maintaining good multilayer compatibility. The aperture stop APE' is located between M1' and M2' and is significantly spaced from either mirror, e.g., more than 200 mm.

In addition to the features outlined by the first preferred embodiment, this second preferred embodiment teaches that the tertiary mirror M3' may be located on the object side of the primary mirror M1' (i.e., closer to the object OB' than the primary mirror M1'). This feature departs drastically from the teaches of the prior art that show the tertiary mirror must be located either in close proximity to the primary mirror ('079 patent) or on the image side of the primary mirror('310 patent). This location of mirror M3' enables a reduction in the overall length from object plane OB to image plane IM (total track length) by some 250 mm. This decrease in total track length is accomplished by shifting the tertiary mirror from the image side of the primary mirror M1' to the object side of the primary mirror M1' and then decreasing the distance between mirror M1' and mirror M6'. This also allows the parent diameter of the tertiary mirror M3' to be smaller than either the primary mirror M1' or the secondary mirror M2'. These changes affect the angular condition of the chief rays upon reflection from the secondary mirror M2'. Prior art teaches that the chief ray from the central field point must diverge from the optical axis after reflection from the secondary mirror ('310 patent, '079 patent, etc.), but now the chief ray CR' assumes a more parallel condition with respect to the optical axis OA'. In this second embodiment, this chief ray CR' is made identically parallel to the optical axis OA'. This change in chief ray angle impacts the aberration balance in the design enough to form a distinct local minima, so that the residual aberration set seen in a Zernike decomposition of the wavefront differs from that of the first preferred embodiment.

The optical prescription of this second preferred embodiment of FIG. 3 is listed in Table 4 and Table 5. The aspheric mirror surfaces are labeled A(1)–A(6) in the tables with A(1) corresponding to mirror M1, A(2) corresponding to mirror M2, and so on.

Like the first preferred embodiment, the object OB' will be projected to the image IM' at 4× reduction in a ring field format with a telecentric imaging bundle (chief rays parallel to the optical axis OA' at the image IM'). Table 6 provides a performance summary demonstrating that this preferred embodiment is capable of lithographic performance at a wavelength of 13.4 nm. For comparison to the first embodiment, this second preferred embodiment also utilizes a numerical aperture NA of 0.20 at the image IM' and projects a 2 mm wide field in the scan direction. The system is compatible with reflective multilayer coatings since the incidence angles at each mirror are relatively small. As measured by the chief ray CR' from the central field point 29', the incidence angles range from 3.9° to 14.6°. The exact chief ray incidence angles for the chief ray CR' from the central field point 29' are: Object OB': 5.6°; M1: 7.2°; M2: 4.4°; M3: 14.6°; M4: 8.8°, M5: 9.7°, and M6: 3.9°. Again, these low incidence angles are a key enabling element for EUV lithography since the low incidence angles minimize the multiplayer induced amplitude and phase errors that have an adverse impact to lithographic performance.

The composite RMS wavefront error across the field is 0.0131λ (0.18 nm), ranging from 0.0095λ (0.13 nm) at the best field point to 0.0157λ (0.21 nm) at the worst. The distortion of the chief ray has been reduced to less than 1 nm across the field. Clearly this combination of telecentric imaging, a highly corrected wavefront, and essentially no distortion demonstrates that this system is suitable for modern lithography at soft x-ray or extreme ultratviolet wavelengths.

This preferred embodiment has further advantages in that the system of FIG. 3 may be scaled in either numerical aperture or field to address even more advanced requirements. The results of a simple numerical aperture scaling experiment demonstrate that this preferred embodiment easily supports scaling to larger numerical apertures. Without making any modifications, an analysis of the composite root mean square (RMS) wavefront error was made at a numerical aperture of 0.22, which represents a 10% increase to the value shown in Table 4. The composite RMS wavefront error was found to be 0.027λ (0.36 nm), a level that supports lithographic quality imaging.

The results of another simple scaling experiment demonstrate that this preferred embodiment easily supports increases in field width. Without making any modifications, an analysis of the composite RMS wavefront error was made over a 3 mm wide arcuate slit, which represents a 50% increase to the value shown in Table 6. The composite RMS wavefront error was found to be 0.028λ (0.38 nm), again a level that supports lithographic quality imaging.

Third Preferred Embodiment:

The third preferred embodiment is shown in FIG. 4. Like the first and second preferred embodiments, this system utilizes a re-imaging PPNPNP configuration with a physically accessible aperture stop APE" that is located between the primary mirror M1" and secondary mirror M2". And like the first and second embodiments, the intermediate image IMI" is located between the secondary mirror M2" and the tertiary mirror M3". Similar to the second embodiment, the tertiary mirror M3" is located on the object side of the primary mirror M1". This particular embodiment differs from the second preferred embodiment in that the chief ray CR" from the central field point 29" converges toward the optical axis OA" after reflection from the secondary mirror M2", thus forming another advantageous projection system with distinct characteristics.

The optical prescription for this third embodiment of FIG. 4 is listed in Table 7 and Table 7. Table 7 lists the vertex radius of curvature as well as the separation between these mirrors along the optical axis. Each mirror is aspheric and labeled A(1)–A(6) in the tables with A(1) corresponding to mirror M1", A(2) corresponding to mirror M2", and so on. The prescription of the aspheric surface deformation per equation (1) is listed in Table 8. Taken together with the information provided in Table 9, an illustrative and exempary description of this prefered embodiment is disclosed.

Like the first two preferred embodiments, the object OB", e.g. a pattern on mask or reticle, will be projected to the image IM" at 4x reduction in a ring field format with a telecentric imaging bundle (chief rays parallel to the optical axis at the image). At the image" typically a semiconductor wafer is arranged. Table 6 provides a performance summary demonstrating that this preferred embodiment is capable of lithographic performance at a wavelength of 13.4 nm. For comparison purposes, this third preferred embodiment also utilizes a numerical aperture NA of 0.20 at the image IM" and projects a 2 mm wide field in the scan direction. The system is compatible with reflective multilayer coatings since the incidence angles at each mirror are relatively small. As measured by the chief ray CR" from the central field point 29", the incidence angles range from 3.9° to 13.9°. The exact chief ray incidence angles from the central field point are: Object OB": 6.6°; M1: 8.0°; M2: 4.4°; M3: 13.9°; M4: 8.6°, M5: 9.6°, and M6: 3.9°. Again, these low incidence angles are a key enabling element for EUV lithography since the low incidence angles minimize the multiplayer induced amplitude and phase errors that have an adverse impact to lithographic performance.

The composite wavefront error across the field is 0.0203λ (0.27 nm), ranging from 0.0148λ (0.20 nm) at the best field point to 0.0243λ (0.33 nm) at the worst. The distortion of the chief ray has been reduced to less than 1 nm across the field. Clearly this combination of telecentric imaging, a highly corrected wavefront, and essentially no distortion demonstrates that this system is suitable for modern lithography at soft x-ray or extreme ultraviolet wavelengths. The design can also be scaled in numerical aperture or field like second preferred embodiment.

The optical design descriptions provided above for the first–third embodiments herein demonstrate an advantageous catoptric projection system concept for EUV lithography. While these embodiments have been particularly described for use in a 13.4 nm tool, the basic concept is not limited to use with lithographic exposure tools at this wavelength, either shorter or longer, providing a suitable coating material exists in the soft x-ray region of the electromagnetic spectrum.

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow, and equivalents thereof. For example, one skilled in the art may reconfigure the embodiments described herein to expand the field of view, increase the numerical aperture, or both, to achieved improvements in resolution or throughput.

TABLE 1

Optical prescription first preferred embodiment

| Element number | Vertex radius of curvature | Thickness (mm) | Glass |
| --- | --- | --- | --- |
| Object OB | INFINITY | 806.775 | |
| A(1) | −1997.63 | −328.184 | REFL |
| Aperture Stop APE | INFINITY | −399.404 | |
| A(2) | 1148.069 | 649.7918 | REFL |
| Intermediate image IMI | INFINITY | 132.9323 | |
| A(3) | 486.7841 | −277.569 | REFL |
| A(4) | 660.9159 | 890.6587 | REFL |
| A(5) | 393.8628 | −476.472 | REFL |
| A(6) | 580.3377 | 501.472 | REFL |
| Image IM | | | |

TABLE 2

Aspheric prescription

| Aspheric | K | A | B | C | D | E |
|---|---|---|---|---|---|---|
| A(1) | −9.1388E+01 | 5.4676E−10 | 7.0301E−15 | −1.4409E−19 | 2.1657E−25 | 5.5712E−30 |
| A(2) | −6.4930E−01 | 3.7924E−11 | 3.2952E−18 | −1.1462E−21 | 8.4115E−26 | −4.9020E−30 |
| A(3) | −2.3288E−01 | 3.3571E−10 | 1.8240E−14 | −1.9218E−19 | −4.2667E−23 | 2.9468E−23 |
| A(4) | −6.4180E−03 | 3.9345E−11 | 1.8257E−16 | −6.9023E−22 | 1.3692E−26 | −6.2042E−32 |
| A(5) | 1.5857E+00 | −1.7764E−09 | 7.7970E−14 | −1.2619E−18 | 5.4017E−22 | −3.8012E−26 |
| A(6) | 8.9884E−02 | −4.2455E−12 | 1.4898E−17 | 1.4824E−22 | −7.0550E−28 | 6.6775E−32 |

TABLE 3

Performance summary first preferred embodiment

| Metric | Performance |
|---|---|
| Wavelength | 13.4 nm |
| Numerical aperture (image) | 0.20 |
| Ringfield format (image) | |
| i. Radius | 30.0 mm |
| ii. Width | 2.0 mm |
| iii. Chord | 26.0 mm |
| Reduction ratio (nominal) | 4:1 |
| Overall length (mm) | 1500 mm |
| RMS wavefront error | |
| (waves @ λ = 13.4 nm) | |
| i. Composite | 0.0125λ |
| ii. Variation | 0.0076λ–0.0167λ |
| Chief ray distortion (max) | 1.9 nm |
| Exit pupil location | Infinity |
| Max. aspheric departure across | |
| instantaneous clear aperture (ICA) | |
| i. M1 | 25.0 μm |
| ii. M2 | 0.5 μm |
| iii. M3 | 1.4 μm |
| iv. M4 | 14.0 μm |
| v. M5 | 3.0 μm |
| vi. M6 | 3.8 μm |

TABLE 4

Optical prescription second preferred embodiment

| Element number | Vertex radius of curvature | Thickness (mm) | Glass |
|---|---|---|---|
| Object Plane OB' | INFINITY | 786.7828 | |
| A(1) | −1522.9647 | −275.3849 | REFL |
| Aperture Stop APE' | INFINITY | −461.3979 | |
| A(2) | 922.8035 | 452.3057 | REFL |
| Intermediate image IMI' | INFINITY | 95.0000 | |
| A(3) | 273.0204 | −218.5016 | REFL |
| A(4) | 511.1320 | 834.1959 | REFL |
| A(5) | 434.1472 | −326.2172 | REFL |
| A(6) | 440.9571 | 363.2172 | REFL |
| Image IM' | | | |

TABLE 5

Aspheric prescription second preferred embodiment

| Aspheric | K | A | B | C | D | E |
|---|---|---|---|---|---|---|
| A(1) | −6.5661E−04 | 3.6028E+01 | 2.7656E−09 | 1.3237E−14 | 5.6475E−20 | 1.4711E−23 |
| A(2) | 1.0837E−03 | −3.0142E+00 | 3.2384E−10 | −6.8499E−16 | −1.8748E−20 | 1.0985E−24 |
| A(3) | 3.6627E−03 | 1.9328E+00 | −1.6611E−08 | −4.9082E−13 | 2.9169E−17 | −3.8673E−27 |
| A(4) | 1.9564E−03 | −1.2442E−01 | −1.0927E−11 | 2.7712E−16 | −2.0608E−21 | 3.6395E−26 |
| A(5) | 2.3034E−03 | 8.5377E+00 | −6.9001E−09 | −2.2929E−13 | −8.9645E−18 | −2.1791E−27 |
| A(6) | 2.2678E−03 | 1.4526E−01 | 3.2069E−11 | 3.3003E−16 | 5.1329E−21 | −1.7296E−25 |

TABLE 6

Performance summary second preferred embodiment

| Metric | Performance |
|---|---|
| Wavelength | 13.4 nm |
| Numerical aperture (image) | 0.20 |

TABLE 6-continued

Performance summary second preferred embodiment

| Metric | Performance | |
|---|---|---|
| Ringfield format (image) | | |
| i. Radius | 30.0 | mm |
| ii. Width | 2.0 | mm |
| iii. Chord | 26.0 | mm |
| Reduction ratio (nominal) | 4:1 | |
| Overall length (mm) | 1250 | |
| RMS wavefront error (waves @ $\lambda$ = 13.4 nm) | | |
| i. Composite | 0.0131$\lambda$ | |
| ii. Variation | 0.0095$\lambda$–0.0157$\lambda$ | |
| Chief ray distortion (max) | 0.9 | nm |
| Exit pupil location | Infinity | |
| Max. aspheric departure across instantaneous clear aperture (ICA) | | |
| i. M1' | 18.0 | $\mu$m |
| ii. M2' | 6.2 | $\mu$m |
| iii. M3' | 8.7 | $\mu$m |
| iv. M4' | 28.0 | $\mu$m |
| v. M5' | 7.0 | $\mu$m |
| vi. M6' | 7.0 | $\mu$m |

TABLE 7

Optical prescription third preferred embodiment

| Element number | Vertex radius of curvature | Thickness (mm) | Glass |
|---|---|---|---|
| Object OB" | INFINITY | 708.2375 | |
| A(1) | −1351.9353 | −222.3328 | REFL |
| Aperture Stop APE" | INFINITY | −435.9047 | |
| A(2) | 801.1198 | 389.5537 | REFL |
| Intermediate image IMI" | INFINITY | 85.9324 | |
| A(3) | 257.6903 | −223.6826 | REFL |
| A(4) | 508.9915 | 827.9429 | REFL |
| A(5) | 434.7744 | −321.5090 | REFL |
| A(6) | 436.7586 | 358.5090 | REFL |
| Image IM" | | | |

TABLE 8

Aspheric prescription third preferred embodiment

| Aspheric | K | A | B | C | D | E |
|---|---|---|---|---|---|---|
| A(1) | −7.3968E−04 | 1.8042E+00 | 2.2388E−09 | 4.0136E−15 | 6.8479E−19 | −1.2865E−22 |
| A(2) | 1.2483E−03 | −2.6267E+00 | 4.4819E−10 | −1.7571E−15 | 5.8143E−20 | −3.7874E−24 |
| A(3) | 3.8806E−03 | −8.5604E−01 | 2.2165E−08 | −6.7204E−12 | 1.1406E−15 | −1.0131E−19 |
| A(4) | 1.9647E−03 | −7.7387E−02 | −3.8053E−11 | −1.2483E−15 | 2.8880E−20 | −3.4746E−25 |
| A(5) | 2.3000E−03 | 8.3687E+00 | −6.1944E−09 | −1.9683E−13 | −1.6280E−17 | 4.8296E−21 |
| A(6) | 2.2896E−03 | 1.3269E−01 | 5.6594E−11 | 5.5533E−16 | −1.1978E−21 | 7.3097E−25 |

TABLE 9

Performance summary third preferred embodiment

| Metric | Performance | |
|---|---|---|
| Wavelength | 13.4 nm | |
| Numerical aperture (image IM") | 0.20 | |

TABLE 9-continued

Performance summary third preferred embodiment

| Metric | Performance | |
|---|---|---|
| Ringfield format (image IM") | | |
| i. Radius | 30.0 | mm |
| ii. Width | 2.0 | mm |
| iii. Chord | 26.0 | mm |
| Overall length (mm) | 1156 | |
| Reduction ratio (nominal) | 4:1 | |
| RMS wavefront error (waves @ $\lambda$ = 13.4 nm) | | |
| i. Composite | 0.0203$\lambda$ | |
| ii. Range | 0.0148$\lambda$–0.0243$\lambda$ | |
| Chief ray distortion (max) | 1.5 | nm |
| Exit pupil location | Infinity | |
| Max. aspheric departure across instantaneous clear aperture (ICA) | | |
| i. M1" | 17.3 | $\mu$m |
| ii. M2" | 6.4 | $\mu$m |
| iii. M3" | 9.7 | $\mu$m |
| iv. M4" | 32.2 | $\mu$m |
| v. M5" | 6.7 | $\mu$m |
| vi. M6" | 6.7 | $\mu$m |

In FIG. 5 the object field 1100 of a projection exposure apparatus in the object plane of the projection objective according to the invention is shown. The object plane is imaged by means of the projection objective in an image plane, in which a light sensitive object, for example a wafer with a light sensitive material is arranged. The image field in the image plane has the same shape as the object field. The object- or the image field 1100 has the configuration of a segment of a ring field. The ring field has an axis of symmetry 1200.

In addition the axis extending the object plane, i.e., the x-axis and the y-axis are depicted. As can be seen from FIG. 5, the axis of symmetry 1200 of the ring field runs in the direction of the y-axis. At the same time the y-axis coincides with the scanning direction of an projection exposure apparatus, which is designed as a ring field scanner. The x-direction is thus the direction that stands perpendicular to the scanning direction, within the object plane. The ring field has a so called ring field radius R, which is defined by the distance of the central field point 1500 of the image field from the principal axis (PA) of the projection objective. The arc-shaped field in the object plane as well as in the image plane has a arc shaped field width W, which is the extension of the field in scanning or in y-direction and a secant length SL.

In FIGS. 6, 8 and 9, arrangements of the six-mirror projection objectives are shown. Each embodiment has a free working distance that corresponds at least to the used diameter of the physical mirror surface or mirror segment next to the wafer. In contrast, FIG. 7 shows a prior art system for use with wavelengths >100 nm, such as the system of U.S. Pat. No. 5,686,728. In all embodiments shown in FIGS. 6, 8 and 9, the same reference numbers will be used for the same components and the following nomenclature will be employed:

first mirror (S1), second mirror (S2), third mirror (S3), fourth mirror (S4), fifth mirror (S5), and sixth mirror (S6)

In particular, FIG. 6 shows a six-mirror projection objective with a ray path from the object plane 2, i.e. reticle plane to the image plane 4, i.e. wafer plane. The embodiment includes a field mirror S1, which forms a virtual image of an object with an imaging ratio β>0. A three-mirror system formed from S2, S3 and S4 is also provided and produces a real, reduced image of the virtual image as the intermediate image, Z. Lastly, a two-mirror system S5, S6, images the intermediate image Z in the wafer plane 4 while maintaining the requirements of telecentricity. The aberrations of the three-mirror and two-mirror subsystems are balanced against one another so that the total system has a high optical quality sufficient for integrated circuit fabrication applications.

The physical aperture stop B is arranged between the second mirror S2 and the third mirror S3. And, as is clear from FIG. 6, the aperture stop is accessible in the ray path between the second mirror S2 and the third mirror S3. Furthermore, the distance between the vertex V5 of the surface of the mirror next to the wafer, i.e., the surface of the fifth mirror S5 in the present embodiment, and the image plane is greater than the used diameter of the physical mirror surface of mirror S5. The used diameter of a physical mirror surface is explained in more detail in the description of FIGS. 12A and 12B. In other words, the following condition is fulfilled:

physical distance from the vertex V5 of the surface of mirror S5 to the image plane 4>used diameter of mirror S5.

Other distance requirements are also possible and may be used, such as the physical distance is (1) greater than the sum of one-third of the used diameter of the mirror next to the wafer, S5, and 20 mm, or (2) greater than 50 mm. In the preferred embodiment, the physical distance is 60 mm.

Such a physical distance guarantees a sufficiently free working distance A, and allows the use of optical components compatible for use with wavelengths<100 nm, and preferably wavelengths of 11 to 13 nm. Optical components in this range include, for example, Mo/Si or Mo/Be multilayer systems, where the typical multilayer systems for λ=13 nm is Mo/Si layer pairs and for λ=11 nm, is Mo/Be systems, both of approximately 70 layer pairs. Reflectivities attainable in such systems are approximately 70%. In the multilayer layer systems, layer stresses of above 350 MPa may occur. Stresses of such values may induce surface deformation, especially in the edge regions of the mirror.

The systems according to the invention, as they are shown, for example, in FIG. 5, have:

$$RES=k_1 \lambda/NA.$$

This results in a nominal resolution of at least 50 nm and 35 nm at a minimum numerical aperture of NA=0.2 for $k_1$=0.77 and λ=13 nm, and for $k_1$=0.64 and λ=11 nm, respectively, where $k_1$ is a parameter specific for the lithographic process.

Furthermore, the light path for a bundle of light rays running from the object plane to the image plane of the objective shown in FIG. 6 is obscuration-free. For example, in order to provide image formats of 26×34 mm$^2$ or 26×52 mm$^2$, the projection objectives according to the invention are preferably used in an arc-shaped field scan projection exposure apparatus, wherein the secant length of the scan slit is at least 26 mm.

Numerous masks can be used in the projection exposure apparatus. The masks or reticle are arranged in the object plane of the projection objective. The masks include transmission masks, stencil masks and reflection masks. The projection objective, which is telecentric on the image side, i.e. in the image plane, can be telecentric or non-telecentric on the object side, i.e. in the object plane depending on which mask is used. For example, if the bundle of light rays is telecentric on the object-side when using a reflection mask a transmission-reducing beam splitter must be employed. If the bundle of light rays is non-telecentric on the object-side, unevennesses of the mask leads to dimensional errors in the image. Therefore, the angle of incidence of the chief ray of the bundle of light rays through the central field point 1500 in the object plane is preferably below 10°, so that the requirements for reticle evenness lies in an achievable range. Moreover, the system of FIG. 6 which is telecentric on the image side has an image-side error of telecentry at the wafer level of 1 mrad for a image side numerical aperture of 0.2.

Due to the high image-side telecentricity, the entrance pupil of the last mirror S6 is at or near the focal plane of this mirror. Therefore, in systems with an intermediate image as described before, the aperture, B, is in the front, low-aperture objective part preferably in the light path between the first and third mirror S1, S3. Thus the pupil plane conjugated with the aperture stop will be imaged in the focal plane of the last mirror.

All mirrors S1–S6 of FIG. 6 are designed to be aspherical, with a maximum asphericity of approximately 7.3 μm. The low asphericity of the embodiment shown in FIG. 6 is advantageous from a manufacturing point of view, since the technological difficulties in processing the surfaces of the multilayer mirrors increases proportionally with aspherical deviation and gradient of the asphere.

The highest angle of incidence of a ray impinging a mirror surface in the six-mirror objective shown in FIG. 6 occur on the fifth mirror S5 and is approximately 18.4°. The maximum variation of the angles of incidence of the rays within a bundle of light rays impinging onto a mirror surface occurs on mirror surface of mirror S5 and is approximately 14.7°. The wavefront error at λ=13 nm is better than 0.032λ; the centroid distortion of the point spread function is <3 mm; and the static, dimension-corrected distortion lies at 4 nm.

A freely accessible aperture stop between the second and third mirror as well as no vignetting of the bundle of light rays running from S3 to S4 by the aperture stop is achieved with small angles of incidence of the rays impinging onto the mirror surfaces when the following distance conditions are fulfilled:

$$0.5<S1S3/S1S2<2$$

and $$0.5<S2 \text{ aperture}/(S3 \text{ aperture})<2.$$

Here, the abbreviation S1S3 means the mechanical distance or physical distance between the vertices V1 and V3 of the surface of the mirrors S1 and S3. And, "S2 aperture" means the mechanical distance between the vertex V2 of the surface of mirror S2 and the aperture. Furthermore, in order to reduce the angles of incidence on the mirrors in any of the embodiments of FIGS. 6, 8, and 9, the distance from the object plane, where e.g. the reticle is situated to the vertex of the surface of the mirror S1 is made smaller than the mechanical distance from the vertex of the surface of mirror S2 to the vertex of the surface of mirror S3, i.e., the following applies:

reticle S1<S2S3.

To ensure a sufficient free working distance A not only on the image side but also on the object side the reticle is situated sufficiently far in front of the first mirror next to the object plane, which is in the present case the surface of the second mirror S2. In the present case, for example, the physical distance between the reticle and the vertex V2 of the surface of mirror S2 is 80 mm.

Furthermore, in the embodiments of FIGS. 6 and 8 to 10, the physical distance between the mirrors S3 and S6 is chosen that mirrors of sufficient thickness can be used. Thicker mirrors have sufficient strength and stability properties that can withstand the high layer tensions described above. In these systems, the following relationship is preferred:

0.3 (used diameter S3+used diameter S6)<S3S6.

Here S3S6 denotes the physical distance between the vertex V3 of the surface of mirror S3 and the vertex V6 of the surface of the mirror S6.

In the following table 10, the parameters of the system represented in FIG. 6 are exemplarily shown in Code V(™) nomenclature. The objective is a 5× system with a 26×2 mm² arc-shaped field in the image plane, wherein 26 mm is the secant length of the arc-shaped field and 2 mm is the width W of the arc shaped field. Furthermore the numerical aperture is 0.2 on the image side. The mean image side radius of the system is approximately 26 mm.

TABLE 10

| element No. | radius | Thickness | diameter | Type |
|---|---|---|---|---|
| Object | INF | 80.9127 | 258.1723 | |
| | | 413.0257 | | |
| S1 | A(1) | −88.8251 | 197.5712 | REFL |
| | | −324.2006 | 195.6194 | |
| | | 0.0000 | 188.6170 | |
| S2 | A(2) | 324.2006 | 188.7078 | REFL |
| | | aperture | 67.1796 | |
| | | 423.6214 | 183.2180 | |
| | | 0.0000 | | |
| S3 | A(3) | −423.6214 | 184.7062 | REFL |
| | | −74.9270 | 519.0546 | |
| S4 | A(4) | 498.5484 | 541.0453 | REFL |
| | | 109.8242 | 248.6244 | |
| | | 281.5288 | 177.5488 | |
| S5 | A(5) | −281.5288 | 65.0842 | REFL |
| S6 | A(6) | 281.5288 | 187.9549 | REFL |
| | | | 78.3999 | |
| Image | image width | 59.9202 | 53.9889 | | aspherical constants:
$$Z = (CURV) Y^2/[1 + (1 - (1 + K) (CURV)^2 Y^2)^{1/2}] + (A)Y^4 + (B)Y^6 + (C)Y^8 + (D)Y^{10}$$

| asphere | CURV | K | A | B | C | D |
|---|---|---|---|---|---|---|
| A(1) | 0.00031800 | −27.686599 | 0.00000E+00 | 1.32694E−15 | 2.00546E−20 | −8.49471E−25 |
| A(2) | 0.00094928 | −3.998204 | 0.00000E+00 | 4.03849E−15 | −6.15047E−20 | 2.73303E−25 |
| A(3) | 0.00126752 | 0.424198 | 0.00000E+00 | 1.58766E−15 | −8.27965E−20 | 2.80328E−24 |
| A(4) | 0.00123850 | 0.023155 | 0.00000E+00 | 2.46048E−17 | −1.08266E−22 | 3.75259E−28 |
| A(5) | 0.00329892 | 2.902916 | 0.00000E+00 | 1.55628E−12 | −6.71619E−17 | −5.30379E−21 |
| A(6) | 0.00277563 | 0.072942 | 0.00000E+00 | 2.96285E−16 | 3.99125E−21 | 4.55007E−26 |

Reference wavelength = 13 nm

FIG. 7 shows an arrangement of a projection objective for microlithography with a wavelength of λ<100 nm according to U.S. Pat. No. 5,686,728. Components substantially similar to those of FIG. 6 are provided with the same reference numbers. As is clear, the physical distance between the vertex V5 of the surface of the mirror next to the image plane S5 and the image plane, where the wafer is situated is significantly smaller than the used diameter of the fifth mirror S5, lying mainly in the range of approximately 20 mm. This leads to strength and stability problems for the optics in the EUV region because of the extreme tensions in the layers. Furthermore, the system has asphericities of ±50 μm and a maximum angle of incidence of 38°.

FIG. 8 is an alternative embodiment of a six-mirror system in which the aperture stop is situated on the first mirror. The same components as in FIG. 6 again receive the same reference number in FIG. 8. The free working distance A to the wafer is 60 mm in this embodiment, as it was in the embodiment of FIG. 6, and thus it is greater than the used diameter of the mirror next to the wafer, S5. Similarly, as with FIG. 6, the physical distance between the vertex V2 of the surface of mirror S2 and the vertex V3 of the surface of mirror S3 was increased significantly in comparison to that of U.S. Pat. No. 5,686,728, so that large angles of incidence can be avoided in the system.

One difference to the objective of FIG. 6, is that in FIG. 8 the aperture stop B is placed on the first mirror S1. As a result of this position, a reduction in vignetting from the light reflected on S2 is possible, whereas with the physical aperture stop positioned between S1 and S2 light of the bundle of light rays running thorough the objective could pass above the aperture stop which is designed as a narrow ring. In the embodiment shown in FIG. 4, the aperture can be either an opening in the S1 mirror or an aperture disposed behind S1 close to this mirror.

Another advantage of this embodiment is the spherical design of mirror S4, which presents advantages especially from the point of view of manufacturing, because mirror S4 is the largest mirror of the system. With such a design, the asphericity in the used range is increased slightly to 10.5 µm. The largest angle of incidence occurs on mirror S5 and is approximately 18.6°. The wavefront error of the arrangement is 0.032λ, within a 1.7 mm wide arc-shaped field at λ=13 nm. Furthermore, if the mirror S4 is designed to be slightly aspherical with 0.4 µm, then the wavefront error can be kept to 0.031λ within a 1.8 mm wide arc-shaped field at λ=13 nm. Efficient masking of the undesirable light is obtained not only when the aperture stop is formed directly on mirror S1, but also when it is arranged behind, i.e., after, mirror S1. Preferably, the aperture stop is positioned such that the following relationship is obtained:

$S2S1 \leq 0.9 \times S2$ aperture.

S2S1 denotes the mechanical distance of the vertex V2 of the surface of mirror S2 and the vertex V1 of the surface of the mirror S1.

Table 11 shows the constructional data of the 5× objective according to FIG. 8 in Code V(™) nomenclature, where the fourth mirror S4 is spherical. The mean radius of the 26×1.7 mm² image field is approximately 26 mm.

TABLE 11

| element No. | Radius | Thickness | diameter | type |
|---|---|---|---|---|
| Object | INF | 85.2401 | 256.1389 | |
| | | 358.4668 | | |
| S1 | A(1) | 0.0024 | 203.8941 | REFL |
| | | −358.4691 | 203.8845 | |
| | | 0.0000 | 201.9677 | |
| S2 | A(2) | 358.4691 | 201.9942 | REFL |
| | | aperture | 60.7572 | |
| | | 390.5456 | 187.2498 | |
| | | 0.0000 | | |
| S3 | A(3) | −390.5456 | 188.9474 | REFL |
| | | −104.1273 | 505.8686 | |
| S4 | A(4) | 494.6729 | 550.3686 | REFL |
| | | 114.3062 | 256.9217 | |
| | | 281.6969 | 181.7337 | |
| S5 | A(5) | −281.6969 | 64.4286 | REFL |
| S6 | A(6) | 281.6969 | 187.8549 | REFL |
| | | | 78.1545 | |
| Image | image width | 60.0041 | 53.6996 | | aspherical constants:
$Z = (CURV) Y^2/[1 + (1 - (1 + K) (CURV)^2 Y^2)^{1/2}] + (A)Y^4 + (B)Y^6 + (C)Y^8 + (D)Y^{10}$

| asphere | CURV | K | A | B | C | D |
|---|---|---|---|---|---|---|
| A(1) | 0.00035280 | −58.238840 | 0.00000E+00 | 2.14093E−15 | 2.29498E−20 | 0.00000E+00 |
| A(2) | 0.00097971 | −4.160335 | 0.00000E+00 | 1.54696E−15 | 8.15622E−21 | 0.00000E+00 |
| A(3) | 0.00117863 | −2.136423 | 0.00000E+00 | −1.78563E−16 | 3.45455E−20 | 0.00000E+00 |
| A(4) | 0.00124362 | 0.000000 | 0.00000E+00 | 0.00000E+00 | 0.00000E+00 | 0.00000E+00 |
| A(5) | 0.00338832 | 2.909987 | 0.00000E+00 | 7.90123E−13 | 7.04899E−17 | 0.00000E+00 |
| A(6) | 0.00278660 | 0.062534 | 0.00000E+00 | 2.79526E−16 | 7.00741E−21 | 0.00000E+00 |

Reference wavelength = 13 nm

Another embodiment is shown in FIG. 9, where again the same reference numbers are used for the same components as in the previous figures. Here, the aperture stop B is placed optically and physically on the secondary mirror or second mirror S2. The ability to place the aperture stop on S2 makes manufacturing easier. Therefore this arrangement is advantageous. The system of FIG. 9 is a 4× reduction system with a wavefront error of 0.021λ within a 2 mm wide image side arc-shaped field at λ=13 nm. The maximum asphericity in the used range lies at 11.2 µm, and the largest angle of incidence, which occurs at S5, is approximately 18.3°. The ring field radius R as defined in FIG. 1 of the arc-shaped field in the image plane is approximately 26 mm, as with the previous two embodiments. Furthermore, the distance between the image plane and the vertex V5 of the surface of the mirror next to the image plane, S5, is greater than the used diameter of the mirror next to the wafer, S5, and lies at around 59 mm in this embodiment.

Table 12 shows the optical parameters of the embodiment of FIG. 9 in Code V(™) nomenclature.

TABLE 12

| element No. | Radius | thickness | diameter | Type |
|---|---|---|---|---|
| Object | INF | 84.0595 | 205.6642 | |
| | | 473.5521 | | |
| S1 | A(1) | −145.8261 | 147.3830 | REFL |
| | | −327.7260 | 136.4700 | |
| | | aperture | 112.0176 | |
| | | 0.0000 | | |
| S2 | A(2) | 473.5521 | 112.1228 | REFL |
| | | 190.4830 | 163.5236 | |
| | | 0.0000 | 184.4783 | |
| S3 | A(3) | −190.4830 | 185.3828 | REFL |
| | | −399.1713 | 358.6720 | |
| S4 | A(4) | 589.6560 | 654.5228 | REFL |
| | | 207.5220 | 310.1977 | |
| | | 276.2668 | 175.3066 | |
| S5 | A(5) | −276.2668 | 65.2138 | REFL |
| S6 | A(6) | 276.2668 | 182.8159 | REFL |
| | | | 77.5085 | |
| image | image width | 59.0000 | 53.9968 | | aspherical constants:
$$Z = (CURV) Y^2/[1 + (1 - (1 + K)(CURV)^2 Y^2)^{1/2}] + (A)Y^4 + (B)Y^6 + (C)Y^8 + (D)Y^{10}$$

| asphere | CURV | K | A | B | C | D |
|---|---|---|---|---|---|---|
| A(1) | 0.00015851 | 441.008070 | 0.00000E+00 | −3.49916E−16 | 1.27478E−19 | −3.37021E−25 |
| A(2) | 0.00089932 | −5.032907 | 0.00000E+00 | −6.95852E−15 | −7.53236E−20 | −2.74751E−24 |
| A(3) | 0.00188578 | 0.913039 | 0.00000E+00 | −1.60100E−15 | −9.53850E−20 | 1.30729E−26 |
| A(4) | 0.00108147 | 0.038602 | 0.00000E+00 | 2.48925E−18 | −5.29046E−24 | −4.37117E−31 |
| A(5) | 0.00269068 | 7.253316 | 0.00000E+00 | −5.70008E−13 | −9.32236E−17 | −6.09046E−21 |
| A(6) | 0.00281036 | 0.150957 | 0.00000E+00 | 1.30822E−15 | 1.86627E−20 | 5.08158E−25 |

Reference wavelength = 13 nm

FIG. 10 shows an embodiment of the invention which includes a field mirror S1, a first subsystem with the second to fourth mirror S2–S4 and a second subsystem with the fifth and sixth mirror, S5, S6. The field mirror S1 with imaging ratio, β, β>0 produces a virtual image of the object in the object plane 2. The virtual image is then imaged by the first subsystem consisting of the second, third and fourth mirrors, S2, S3, S4, which has β<0, producing a real intermediate image Z in a plane conjugate to the object plane 2. The real intermediate image Z is imaged as a real image into image plane 4 by the second subsystem which consists of the fifth and sixth mirrors, S5, S6. The image side numerical aperture of the system is NA=0.28. The optical free working distance A between the vertex of the surface of the last mirror S5 and the image plane 4 corresponds to at least the sum of one-third of the used diameter of the mirror nearest to the image plane and a length which lies between 20 and 30 mm. The aperture stop B is situated on the second mirror S2.

Table 13 shows the optical parameters of the embodiment of FIG. 10 in Code V(™) nomenclature.

TABLE 13

| element No. | Radius | thickness | Diameter | Type |
|---|---|---|---|---|
| Object | INF | 151.2625 | 194.7605 | |
| | | 229.0820 | | |
| S1 | A(1) | −39.4068 | 162.9862 | REFL |
| | | −189.6752 | 147.1426 | |
| | | aperture | 65.0637 | |
| | | 0.0000 | | |
| S2 | A(2) | 229.0820 | 65.1650 | REFL |
| | | 137.5708 | 168.3504 | |
| | | 0.0000 | 230.5128 | |
| S3 | A(3) | −137.5708 | 234.0072 | REFL |
| | | −300.3445 | 386.2567 | |
| S4 | A(4) | 437.9153 | 630.7784 | REFL |
| | | 133.0981 | 343.1578 | |
| | | 353.0840 | 257.0225 | |
| S5 | A(5) | −353.0840 | 79.9521 | REFL |

TABLE 13-continued

| element No. | Radius | thickness | Diameter | Type |
|---|---|---|---|---|
| S6 | A(6) | 353.0840 | 264.2853 | REFL |
|  |  |  | 78.6376 |  |
| image | image width | 44.0000 | 54.0051 |  | aspherical constants:
$$Z = (CURV)\ Y^2/[1 + (1 - (1 + K)\ (CURV)^2Y^2)^{1/2}] + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| asphere | CURV<br>E | K<br>F | A<br>G | B<br>H | C<br>J | D |
|---|---|---|---|---|---|---|
| A(1) | −0.00080028 | 0.000000 | −3.35378E−09 | 5.36841E−14 | −7.86902E−19 | −5.07886E−24 |
|  |  | 0.00000E+00 | 0.00000E+60 | 0.00000E+00 | 0.00000E+00 | 0.00000E+00 |
| A(2) | 0.00040002 | 0.000000 | 1.68187E−08 | 2.05570E−12 | 2.42710E−16 | 5.69764E−20 |
|  |  | 0.00000E+00 | 0.00000E+00 | 0.00000E+00 | 0.00000E+00 | 0.00000E+00 |
| A(3) | 0.00113964 | −2.760663 | 0.00000E+00 | −3.55779E−15 | 1.03881E−19 | −3.64996E−24 |
|  |  | 0.00000E+00 | 0.00000E+00 | 0.00000E+00 | 0.00000E+00 | 0.00000E+00 |
| A(4) | 0.00128753 | 0.019273 | 0.00000E+00 | 5.82746E−18 | −1.77496E−22 | 1.64954E−27 |
|  |  | −6.20361E−33 | 0.00000E+00 | 0.00000E+00 | 0.00000E+00 | 0.00000E+00 |
| A(5) | 0.00373007 | 11.6888968 | 0.00000E+00 | −5.53902E−12 | −4.32712E−16 | −1.54425E−19 |
|  |  | 0.00000E+00 | 0.00000E+00 | 0.00000E+00 | 0.00000E+00 | 0.00000E+00 |
| A(6) | 0.00240387 | −0.002567 | 0.00000E+00 | −6.78955E−16 | −8.39621E−21 | −2.95854E−25 |
|  |  | 0.00000E+00 | 0.00000E+00 | 0.00000E+00 | 0.00000E+00 | 0.00000E+00 |

Reference wavelength = 13 nm

FIG. 11 shows a similar, yet alternative, embodiment to that of FIG. 10 with a six-mirror objective with field mirror S1 as well as first and second subsystems as shown in FIG. 10. The embodiment shown in FIG. 11 comprises as the embodiment in FIG. 10 an intermediate image Z. Furthermore the aperture B is formed on the second mirror S2 similar and the numerical aperture on the image side is NA=0.30. The optical parameters of this alternative embodiment are shown in Table 14 in Code V(™) nomenclature.

TABLE 14

| element No. | radius | thickness | Diameter | type |
|---|---|---|---|---|
| object | INF | 103.2808 | 197.1874 |  |
|  |  | 219.3042 |  |  |
| S1 | A(1) | −39.2890 | 157.6222 | REFL |
|  |  | −180.0152 | 142.1492 |  |
|  |  | aperture | 67.2659 |  |
|  |  | 0.0000 |  |  |
| S2 | A(2) | 219.3042 | 67.4347 | REFL |
|  |  | 131.2051 | 167.6895 |  |
|  |  | 0.0000 | 228.0182 |  |
| S3 | A(3) | −131.2051 | 232.3162 | REFL |
|  |  | −247.5850 | 401.4441 |  |
| S4 | A(4) | 378.7901 | 613.5493 | REFL |
|  |  | 134.4001 | 355.7774 |  |
|  |  | 348.5086 | 268.3735 |  |
| S5 | A(5) | −348.5086 | 81.5255 | REFL |
| S6 | A(6) | 348.5086 | 269.2435 | REFL |
|  |  |  | 75.4983 |  |
| image | image width | 36.1195 | 53.9942 |  | aspherical constants:
$$Z = (CURV)\ Y^2/[1 + (1 - (1 + K)\ (CURV)^2Y^2)^{1/2}] + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| asphere | CURV<br>E | K<br>F | A<br>G | B<br>H | C<br>J | D |
|---|---|---|---|---|---|---|
| A(1) | −0.00061615 | 0.000000 | −5.19402E−09 | 1.09614E−13 | −3.44621E−18 | 1.58573E−22 |
|  |  | −7.07209E−27 | 0.00000E+00 | 0.00000E+00 | 0.00000E+00 | 0.00000E+00 |
| A(2) | 0.00066911 | 0.000000 | 1.69112E−08 | 2.39908E−12 | 2.89763E−16 | 1.00572E−19 |
|  |  | 1.84514E−29 | 0.00000E+00 | 0.00000E+00 | 0.00000E+00 | 0.00000E+00 |
| A(3) | 0.00140031 | 0.000000 | −8.71271E−10 | −1.47622E−15 | −3.40869E−20 | 4.32196E−24 |
|  |  | −2.23484E−28 | 0.00000E+00 | 0.00000E+00 | 0.00000E+00 | 0.00000E+00 |

TABLE 14-continued

| | | | | | | |
|---|---|---|---|---|---|---|
| A(4) | 0.00143731 | 0.000000 | 2.18165E+12 | 2.65405E−17 | −2.01757E−22 | 1.14856E−28 |
| | | 1.49857E−32 | −8.61043E−38 | 0.00000E+00 | 0.00000E+00 | 0.00000E+00 |
| A(5) | 0.00378996 | 0.000000 | 8.54406E−08 | 2.25929E−12 | 3.36372E−16 | 1.92565E−20 |
| | | 5.75469E−24 | 0.00000E+00 | 0.00000E+00 | 0.00000E+00 | 0.00000E+00 |
| A(6) | 0.00246680 | 0.000000 | −3.61754E−12 | −8.29704E−16 | −1.53440E−20 | −2.24433E−25 |
| | | 5.91279E−30 | 0.00000E+00 | 0.00000E+00 | 0.00000E+00 | 0.00000E+00 |

Reference wavelength = 13 nm

Figure 12A:
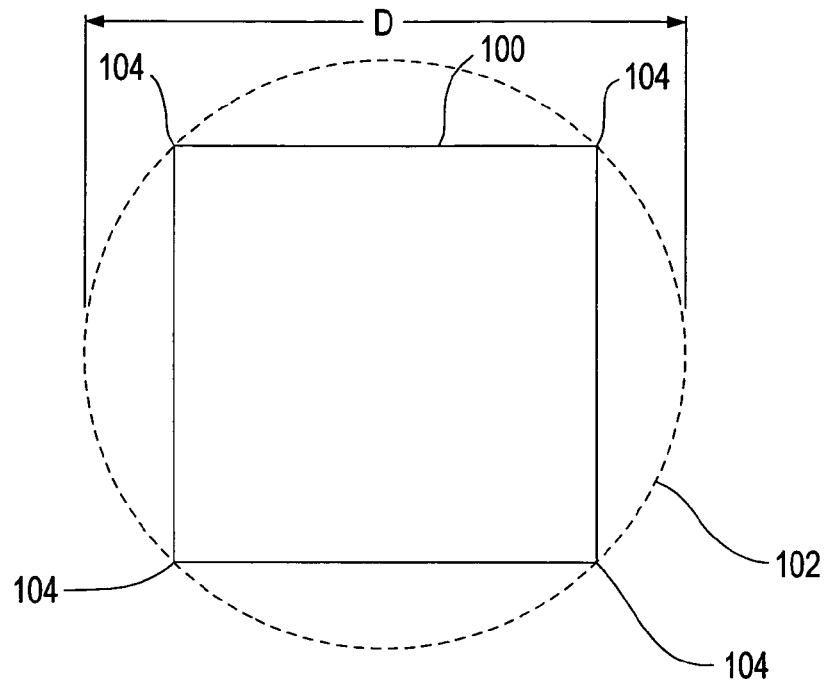
FIGS. 12A and 12B show the used diameter for different physical mirror surfaces or used areas of a mirror.
Figure 12B:
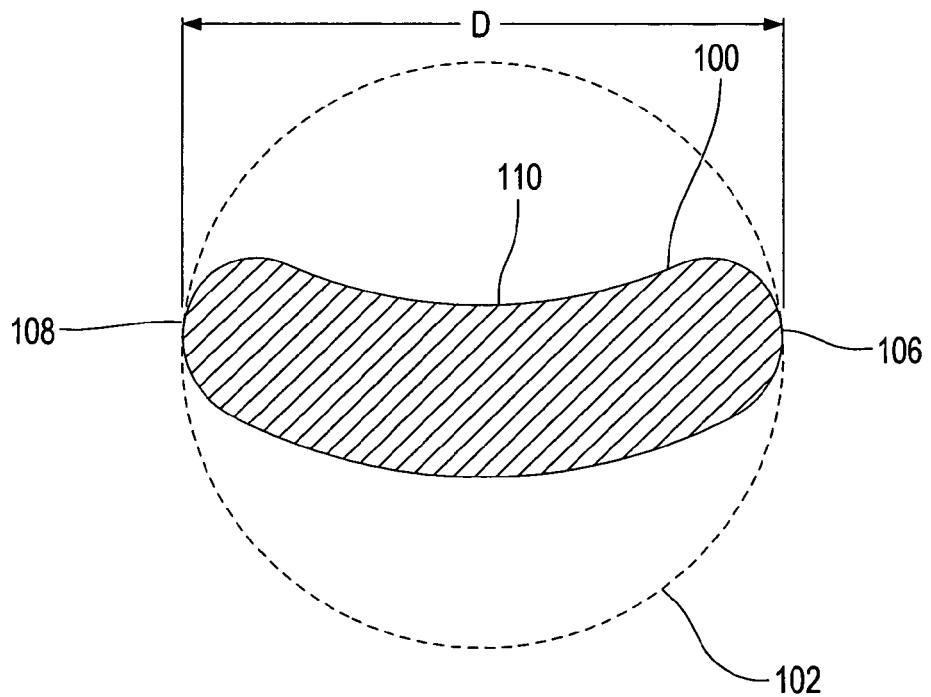

FIGS. 12A and 12B define the used diameter D as used in the description of the above embodiments. As a first example, the illuminated field 100 on a mirror in FIG. 12A is a rectangular field. The illuminated field corresponds to the area on a mirror onto which a bundle of light rays running through the objective from the object side to the image side impinge. The used diameter D according to FIG. 12A is then the diameter of the envelope circle 102, which encompasses the rectangle 100, where the corners 104 of the rectangle 100 lie on the envelope circle 102. A more realistic example is shown in FIG. 12B. The illuminated field 100 has a kidney shape, which is expected for the physical mirror surfaces of the mirrors S1–S6 or the so called used areas of the mirrors S1–S6, when the field in the image plane as well as the field in the object plane is an arc shaped field as depicted in FIG. 5. The envelope circle 102 encompasses the kidney shape fully and it coincides with the edge 110 of the kidney shape at two points, 106, 108. The used diameter D of the physical mirror surface or the used area of the mirrors S1–S6 is then given by the diameter of the envelope circle 102.

Thus, the invention provides a six-mirror projection objective with an imaging scale of preferably 4×, 5× or 6× for use in an EUV projection system. Other uses may be employed, however. The six-mirror projection objective has the resolution required for the image field, which is e.g. arc-shaped and has a advantageous structural design, since the aspheres of the mirror surfaces are relatively low, the angles of incidence of the rays of the bundle of light rays impinging the mirror surfaces are small, and there is enough room for mounting the mirrors.

It should be understood by a person skilled in the art, that the disclosure content of this application comprises all possible combinations of any element(s) of any claims with any element(s) of any other claim, as well as combinations of all claims amongst each other.

What is claimed is:

1. An EUV optical projection system, comprising:
a primary mirror, a secondary mirror, a tertiary mirror, a fourth mirror, a fifth mirror and a sixth mirror, for imaging an object on an image,
wherein said system is configured to form an intermediate image along an optical path from the object to the image between said secondary mirror and said tertiary mirror,
wherein said secondary mirror is concave,
wherein said tertiary mirror is convex, and
wherein said system has a numerical aperture greater than 0.18 at the image.

2. The system according to claim 1, further comprising an aperture stop located along said optical path from said object to said image between said primary mirror and said secondary mirror.

3. The system according to claim 1, wherein said aperture stop is not located on said primary mirror and said aperture stop is not located on said secondary mirror.

4. The system according to claim 1, further comprising:
an optical axis between an object plane and an image plane,
wherein said system is further configured such that a chief ray from a central field point converges toward said optical axis while propagating between said secondary mirror and said tertiary mirror.

5. The system according to claim 1, further comprising:
an optical axis between an object plane and an image plane,
wherein said system is further configured such that a chief ray from a central field point propagates approximately parallel to said optical axis while propagating between said secondary mirror and said tertiary mirror.

6. The system according to claim 1, wherein said tertiary mirror along said optical path from said object to said image is physically located closer to said object than said primary mirror.

7. The system according to claim 1, further comprising:
an optical axis between a object plane and a image plane,
wherein said system is further configured such that a chief ray from a central field point diverges away from said optical axis while propagating between said secondary mirror and said tertiary mirror.

8. The system according to claim 1, wherein said primary mirror along said optical path from said object to said image is physically located closer to said object than said tertiary mirror.

9. The system according to claim 1, wherein said primary mirror is concave, said fourth mirror is concave, said fifth mirror is convex and said sixth mirror is concave.

10. The system according to claim 1,
wherein each of said primary mirror, said secondary mirror, said tertiary mirror, said fourth mirror, said fifth mirror, and said sixth mirror is disposed between said object and said image, and
wherein said object and said image are separated from one another by a physical distance of less than or equal to about 1500 mm.

11. The system according to claim 1,
wherein each of said primary mirror, said secondary mirror, said tertiary mirror, said fourth mirror, said fifth mirror, and said sixth mirror is disposed between said object and said image, and
wherein said object and said image are separated from one another by a physical distance of less than or equal to about 1200 mm.

12. The system according to claim 1, wherein each of said primary mirror, said secondary mirror, said tertiary mirror, said fourth mirror, said fifth mirror, and said sixth mirror receives a chief ray from a central field point at an incidence angle of less than about 15°.

13. The system according to claim 1, wherein five of said primary mirror, said secondary mirror, said tertiary mirror, said fourth mirror, said fifth mirror, and said sixth mirror receive a chief ray from a central field point at an incidence angle of less than about 11°.

14. The system according to claim 1, wherein said system is configured to have a RMS wavefront error of less than or equal to about 0.017λ.

15. The system according to claim 1, wherein said system is configured to have a RMS wavefront error of between 0.017λ and 0.011λ.

16. An EUV optical projection system, comprising:
a primary mirror, a secondary mirror, a tertiary mirror, a fourth mirror, a fifth mirror and a sixth mirror, for imaging an object on an image,
wherein said system is configured to form an intermediate image along an optical path from the object to the image between said secondary mirror and said tertiary mirror,
wherein each of said primary mirror, said secondary mirror, said tertiary mirror, said fourth mirror, said fifth mirror and said sixth mirror receives a chief ray from a central field point at an incidence angle of less than about 15°, and
wherein said system has a numerical aperture greater than 0.18 at the image.

17. The system according to claim 16, wherein five of said primary mirror, said secondary mirror, said tertiary mirror, said fourth mirror, said fifth mirror, and said sixth mirror receive a chief ray from a central field point at an incidence angle of less than about 11°.

18. The system according to claim 16, further comprising:
an optical axis between an object plane and an image plane,
wherein said system is further configured such that a chief ray from a central field point converges toward said optical axis while propagating between said secondary mirror and said tertiary mirror.

19. The system according to claim 16, wherein said tertiary mirror along said optical path from said object to said image is physically located closer to said object than said primary mirror.

20. The system according to claim 16, further comprising:
an optical axis between a object plane and a image plane,
wherein said system is further configured such that a chief ray from a central field point diverges away from said optical axis while propagating between said secondary mirror and said tertiary mirror.

21. The system according to claim 16, wherein said primary mirror along said optical path from said object to said image is physically located closer to said object than said tertiary mirror.

22. The system according claim 16,
wherein said secondary mirror is concave, and
wherein said tertiary mirror is convex.

23. The system according to claim 16,
wherein each of said primary mirror, said secondary mirror, said tertiary mirror, said fourth mirror, said fifth mirror, and said sixth mirror is disposed between said object and said image, and
wherein said object and said image are separated from one another by a physical distance of less than or equal to about 1500 mm.

24. The system according to claim 16,
wherein each of said primary mirror, said secondary mirror, said tertiary mirror, said fourth mirror, said fifth mirror, and said sixth mirror is disposed between said object and said image, and wherein said object and said image are separated from one another by a physical distance of less than or equal to about 1200 mm.

25. An EUV optical projection system, comprising:
a primary mirror, a secondary mirror, a tertiary mirror, a fourth mirror, a fifth mirror and a sixth mirror, for imaging an object on an image; and
an aperture stop located along an optical path from said object to said image between said primary mirror and said secondary mirror,
wherein said secondary mirror is concave,
wherein said tertiary mirror is convex,
wherein said aperture stop is not located on said primary mirror and said aperture stop is not located on said secondary mirror, and
wherein said system has a numerical aperture greater than 0.18 at the image.

26. The system according to claim 25, wherein each of said primary mirror, said secondary mirror, said tertiary mirror, said fourth mirror, said fifth mirror, and said sixth mirror receives a chief ray from a central field point at an incidence angle of less than about 15°.

27. The system according to claim 25, wherein five of said primary mirror, said secondary mirror, said tertiary mirror, said fourth mirror, said fifth mirror, and said sixth mirror receive a chief ray from a central field point at an incidence angle of less than about 11°.

28. An EUV optical projection system, comprising:
a primary mirror, a secondary mirror, a tertiary mirror, a fourth mirror, a fifth mirror and a sixth mirror, for imaging an object on an image, and
an aperture stop located along an optical path from said object to said image between said primary mirror and said secondary mirror,
wherein said system is configured such that a chief ray from a central field point converges toward said optical axis while propagating between said secondary mirror and said tertiary mirror,
wherein said aperture stop is not located on said primary mirror, and said aperture stop is not located on said secondary mirror, and
wherein said system has a numerical aperture greater than 0.18 at the image.

29. The system according to claim 28, wherein said tertiary mirror along said optical path from said object to said image is physically located closer to said object than said primary mirror.

30. The system of claim 1, further comprising at least one additional mirror employed in cooperation with said primary mirror, said secondary mirror, said tertiary mirror, said fourth mirror, said fifth mirror, and said sixth mirror, for imaging said object on said image.

31. The system of claim 1,
wherein said primary mirror and said secondary mirror form a first optical group, and
wherein said tertiary mirror, said fourth mirror, said fifth mirror and said sixth mirror for a second optical group.

32. The system of claim 16, further comprising at least one additional mirror employed in cooperation with said primary mirror, said secondary mirror, said tertiary mirror, said fourth mirror, said fifth mirror, and said sixth mirror, for imaging said object on said image.

33. The system of claim 16,
wherein said primary mirror and said secondary mirror form a first optical group, and wherein said tertiary mirror, said fourth mirror, said fifth mirror and said sixth mirror for a second optical group.

34. The system of claim 25, further comprising at least one additional mirror employed in cooperation with said primary mirror, said secondary mirror, said tertiary mirror, said fourth mirror, said fifth mirror, and said sixth mirror, for imaging said object on said image.

35. The system of claim 28, further comprising at least one additional mirror employed in cooperation with said primary mirror, said secondary mirror, said tertiary mirror, said fourth mirror, said fifth mirror, and said sixth mirror, for imaging said object on said image.

* * * * *

UNITED STATES PATENT AND TRADEMARK OFFICE
CERTIFICATE OF CORRECTION

PATENT NO. : 6,985,210 B2
APPLICATION NO. : 10/454831
DATED : January 10, 2006
INVENTOR(S) : Hudyma et al.

Page 1 of 1

It is certified that error appears in the above-identified patent and that said Letters Patent is hereby corrected as shown below:

Please replace at the title page, Section 63 so that it reads as follows:

--RELATED U.S. APPLICATION DATA

Continuation of application No. PCT/EP01/14301 filed on December 6, 2001, and a continuation-in-part of application No. 10/004,674, filed on December 3, 2001, now Patent No. 6,600,552, which is a continuation-in-part of application No. 09/503,640 filed on February 14, 2000, now Patent No. 6,353,470.--

Signed and Sealed this

Ninth Day of January, 2007

JON W. DUDAS
*Director of the United States Patent and Trademark Office*